(12) United States Patent
Adkisson et al.

(10) Patent No.: US 7,829,945 B2
(45) Date of Patent: Nov. 9, 2010

(54) LATERAL DIFFUSION FIELD EFFECT TRANSISTOR WITH ASYMMETRIC GATE DIELECTRIC PROFILE

(75) Inventors: James W. Adkisson, Jericho, VT (US); Natalie B. Feilchenfeld, Jericho, VT (US); Jeffrey P. Gambino, Westford, VT (US); Benjamin T. Voegeli, Burlington, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 466 days.

(21) Appl. No.: 11/924,650

(22) Filed: Oct. 26, 2007

(65) Prior Publication Data

US 2009/0108347 A1 Apr. 30, 2009

(51) Int. Cl.
*H01L 21/331* (2006.01)
(52) U.S. Cl. .................. 257/335; 257/E29.256
(58) Field of Classification Search .......... 257/335, 257/336, 339, 343, 344, E29.255, E29.256, 257/E29.012; 438/306
See application file for complete search history.

(56) References Cited

U.S. PATENT DOCUMENTS 4,922,327 A   5/1990  Mena et al.
6,521,962 B2  2/2003  Evans
6,593,621 B2  7/2003  Tsuchiko et al.
6,614,077 B2  9/2003  Nakamura et al.
6,900,101 B2  5/2005  Lin
7,554,154 B2 * 6/2009  Herbert .................. 257/340
2004/0065919 A1 4/2004  Wilson et al.

\* cited by examiner

*Primary Examiner*—David Vu
(74) *Attorney, Agent, or Firm*—Scully, Scott Murphy & Presser, P.C.; Richard Kotulak, Esq.

(57) ABSTRACT

A gate stack comprising a uniform thickness gate dielectric, a gate electrode, and an oxygen-diffusion-resistant gate cap is formed on a semiconductor substrate. Thermal oxidation is performed only on the drain side of the gate electrode, while the source side is protected from thermal oxidation. A thermal oxide on the drain side sidewall of the gate electrode is integrally formed with a graded thickness silicon oxide containing gate dielectric, of which the thickness monotonically increases from the source side to the drain side. The thickness profile may be self-aligned to the drain side edge of the gate electrode, or may have a portion with a self-limiting thickness. The graded thickness profile may be advantageously used to form a lateral diffusion metal oxide semiconductor field effect transistor providing an enhanced performance.

12 Claims, 23 Drawing Sheets

LATERAL DIFFUSION FIELD EFFECT TRANSISTOR WITH ASYMMETRIC GATE DIELECTRIC PROFILE

FIELD OF THE INVENTION

The present invention relates to semiconductor structures, and particularly to lateral diffusion metal-oxide-semiconductor field effect transistors (LDMOSFETs) having an asymmetric gate dielectric and methods of manufacturing the same.

BACKGROUND OF THE INVENTION

A lateral diffusion metal-oxide-semiconductor field effect transistor (LDMOSFET) is a field effect transistor having a drift region between a gate and a drain region in order to avoid a high electric field at a drain junction, i.e., at the p-n junction between a body and the drain region. An LDMOSFET is typically employed in high voltage power applications involving voltages in the range from about 5 V to about 50 V, which is applied across the drain region and the source region. A substantial fraction of the high voltage may be consumed within the drift region in the LDMOSFET so that the electric field generated across the gate dielectric does not cause breakdown of the gate dielectric.

A thin gate dielectric is preferred on the source side of a gate electrode to apply a strong electric field to induce current flow, while a thick gate dielectric is preferred on the drain side of the gate electrode to prevent an excessive electric field across the gate oxide in the LDMOSFET. Methods of employing a thicker oxide on the drain side relative to the source side have been known in the art.

Referring to FIG. 1, a first exemplary prior art LDMOSFET structure is shown, which comprises a substrate semiconductor region 110 containing a semiconductor material and having a doping of a first conductivity type and located in a semiconductor substrate 108. Typically, the dopant concentration of the substrate semiconductor region is low, i.e., from about $3.0\times10^{14}/cm^3$ to about $1.0\times10^{16}/cm^3$. A first conductivity type well 130 located in the semiconductor substrate 108 comprises the same semiconductor material as the substrate semiconductor region 110. The first conductivity type well 130 has a doping of the first conductivity type and has a dopant concentration higher than the doping concentration of the substrate semiconductor region 130. A LOCOS (local oxidation of silicon) oxide 150 is present on a portion of a top surface of the semiconductor substrate 108. The LOCOS oxide 150 has two bird's beaks and is integrally formed with a thin silicon oxide layer that is adjoined to one of the bird's beaks. A drift region 140 having a doping of a second conductivity type, which is the opposite of the first conductivity type, is located directly beneath a portion of the LOCOS oxide 150, and is disjoined from the first conductivity type well 130. The drift region 140 comprises the same semiconductor material as the substrate semiconductor region 110. A source region 142 and a drain region 144, each comprising a semiconductor material and having a doping of the second conductivity type, are located within the first conductivity type well 130 and the drift region 140, respectively. A substrate contact semiconductor region 132 comprising the semiconductor material and having a doping of the first conductivity type is also formed in the first conductivity type well 130 at a location farther away from the drift region 140 than the first conductivity type region 130. A source and substrate metal contact 182 is located on the source region 142 and the substrate contact semiconductor region 132. Likewise, a drain metal contact 184 is located on the drain region 184. A gate electrode 160 straddles a portion of the first conductivity type well 130, a portion of the substrate semiconductor region 110, and the drift region 140. A gate spacer 162 and a gate metal contact 186 are located on the gate electrode 160. LOCOS isolation 120 provides electrical isolation between various components on the surface of the semiconductor substrate 108.

Local oxidation of silicon (LOCOS) process employs a silicon substrate having a patterned oxygen-diffusion-resistant layer thereupon. Typically, the oxygen-diffusion-resistant layer is a silicon nitride layer. During a thermal oxidation process, exposed portions of the silicon substrate are thermally oxidized to form thermal silicon oxide. As oxygen atoms diffuse underneath the edge of the oxygen-diffusion-resistant layer, a tapered silicon oxide structure having a concave curvature known as a bird's beak is formed underneath the oxygen-diffusion-resistant layer. Formation of the bird's beak thus requires presence of the oxygen-diffusion-resistant layer. The LOCOS oxide 150 in the first exemplary prior art semiconductor LDMOSFET structure is formed prior to formation of the gate electrode 160 by forming a patterned oxygen-diffusion-resistant layer, e.g., a silicon nitride layer, and performing a thermal oxidation of silicon.

For the LOCOS process, the gate electrode 160 is formed after the formation of the LOCOS oxide 150. Patterning of the gate electrode 160 is performed on a preexisting LOCOS oxide 150. The location of the bird's beak structure relative to the gate electrode 160 is subject to overlay variations of the alignment of the lithographic pattern of the gate electrode and the lithographic pattern of the oxygen-diffusion-resistant layer. Thus, it is inherent in the first exemplary prior art LDMOSFET structure that the thickness profile of the LOCOS oxide 150, which is a gate oxide, is not self-aligned to an edge of the gate electrode 160, and as a consequence, performance of the first exemplary prior art LDMOSFET has significant variations in terms of response of drain current as a function of a gate voltage.

Referring to FIG. 2, a second exemplary prior art LDMOSFET structure known as reduced surface field metal oxide semiconductor field effect transistor (RESURF MOSFET) is shown. The first conductivity type well 130 and the drift region 140 laterally abut each other so that the electric field across a thinner portion of the LOCOS oxide 150 is reduced. The position of the LOCOS oxide 150 relative to the gate electrode 160 is also subject to lithographic overlay variations as in the first exemplary prior art LDMOSFET.

In view of the above, there exists a need for an LDMOSFET structure providing advantageous effects of different gate dielectric thicknesses across the source side edge and the drain side edge of a gate electrode as well as consistent device performance independent of overlay variations in lithographic steps of a manufacturing sequence, and methods of manufacturing the same.

Further, there exists a need for an LDMOSFET structure having a graded gate dielectric thickness from the source side to the drain side, wherein the thickness profile of the gate dielectric is self-aligned to the gate electrode, and methods of manufacturing the same.

In addition, there exists a need for an LDMOSFET structure having well controlled oxide thickness profile having a monotonically increasing gate dielectric thickness from the source side to the drain side, and methods of manufacturing the same.

SUMMARY OF THE INVENTION

The present invention addresses the needs described above by providing an LDMOFET structure having a graded thickness silicon oxide containing gate dielectric, and methods of manufacturing the same. The graded profile may be self-aligned to a drain side edge of a gate electrode, or may contain a portion having a self-limiting thickness.

In the present invention, a silicon oxide containing gate dielectric having a uniform thickness between a source side edge and a drain side edge is formed on a silicon containing substrate. A gate electrode containing a polycrystalline silicon containing alloy and a gate cap comprising an oxygen-diffusion-resistant material such as silicon nitride is formed in a gate stack. An oxygen diffusion barrier layer is formed over a portion of the gate stack on the source side and on a portion of the semiconductor substrate on the source side, while another portion of the gate stack over the drain side is exposed. Thermal oxidation is performed to form a thermal oxide of a silicon containing material on the drain side sidewall of the gate electrode, while forming a graded thickness silicon oxide containing gate dielectric, of which the thickness monotonically increases from the source side to the drain side.

The graded thickness silicon oxide containing gate dielectric is integrally formed with the thermal oxide of the silicon containing material. In one embodiment, lateral diffusion of oxygen through the gate dielectric determines the thickness profile. The thickness profile is self-aligned to the drain side edge of the gate electrode. In another embodiment, a portion of the gate electrode abutting the gate dielectric on the drain side contains a highly doped silicon containing material that may be selectively etched to provide a cavity of self-limiting height. The thickness of thermal oxide formed in the cavity is also self-limiting since the diffusion length for oxygen drastically increases once the cavity is filled with the thermal oxide, which provides a graded thickness silicon oxide containing gate dielectric having a portion with a self-limiting thickness. The graded thickness profile may be advantageously used to form a lateral diffusion metal oxide semiconductor field effect transistor having enhanced performance.

According to an aspect of the present invention, a semiconductor structure is provided, which comprises:
- a semiconductor substrate comprising a first silicon containing material;
- a gate electrode comprising a second silicon containing material, located on the semiconductor substrate, and having a first sidewall and a second sidewall that are located on opposite ends of the gate electrode;
- a gate dielectric containing a silicon oxide containing dielectric material and abutting the semiconductor substrate and a bottom surface of the gate electrode between the first sidewall and the second sidewall, wherein a vertical thickness of the gate dielectric monotonically increases from the first sidewall to the second sidewall; and
- a thermal oxide portion containing a thermal oxide of the second silicon containing material and laterally abutting an entirety of the second sidewall, wherein the gate dielectric and the thermal oxide portion are of integral construction and free of an interface therebetween.

In one embodiment, the semiconductor structure further comprises another thermal oxide portion containing a thermal oxide of the first silicon containing material and vertically abutting the semiconductor substrate, wherein the thermal oxide has a substantially constant thickness, and wherein the thermal oxide portion and the another thermal oxide portion are of integral construction and free of an interface therebetween.

In another embodiment, the gate dielectric contains a first thermal oxide of the first silicon containing material and a second thermal oxide of the second silicon containing material, wherein the first and second thermal oxide are of integral construction.

In even another embodiment, the first silicon containing material is silicon, the second silicon containing material is polysilicon, and the first thermal oxide and the second thermal oxide are thermal silicon oxide.

In yet another embodiment, the semiconductor structure further comprises:
- a first conductivity type well having a doping of a first conductivity type, abutting the gate dielectric, and located underneath the first sidewall and in the semiconductor substrate; and
- a drift region having a doping of a second conductivity type, abutting the gate dielectric, and located underneath the second sidewall and in the semiconductor substrate, wherein the second conductivity type is the opposite of the first conductivity type.

In still another embodiment, the first conductivity type well laterally abuts the drift region.

In still yet another embodiment, the semiconductor structure further comprises a substrate semiconductor region having a doping of the first conductivity type, abutting the gate electrode, and separating the first conductivity type well from the drain region.

In a further embodiment, the semiconductor structure further comprises:
- a source region having a doping of the second conductivity type and located in the first conductivity type well; and
- a drain region having a doping of the second conductivity type and located in the drift region.

In an even further embodiment, semiconductor substrate comprises single crystalline silicon.

In a yet further embodiment, the gate dielectric comprises a first portion having a substantially constant thickness and adjoining the first sidewall and a second portion having a constantly increasing thickness, adjoining the second sidewall, and having a substantially constant rate of increase in thickness per lateral length.

In a still further embodiment, the gate dielectric further comprises a third portion containing a stepwise increase in thickness between the first portion and the second portion.

In a still yet further embodiment, the semiconductor structure further comprises:
- a drain metal contact comprising a metallic material and abutting the drain region;
- another thermal oxide portion containing a thermal oxide of the first silicon containing material having a substantially constant thickness and abutting the drift region and the drain metal contact, wherein the thermal oxide portion and the another thermal oxide portion are of integral construction and free of an interface therebetween.

According to another aspect of the present invention, a method manufacturing a semiconductor structure is provided, which comprises:
- providing a semiconductor substrate containing a first silicon containing material;
- forming a gate stack on the semiconductor substrate, wherein the gate stack includes a gate dielectric having a uniform thickness, a gate electrode comprising a second silicon containing material and having a first sidewall and a second sidewall that are located on opposite ends of the gate electrode, and a gate cap containing an oxygen-diffusion-resistant material;

forming an oxygen-diffusion-resistant layer on the first sidewall, while exposing the second sidewall; and thermally oxidizing the second sidewall and semiconductor material abutting the gate dielectric and thereby expanding the gate dielectric, while preventing oxidation of the first sidewall.

In one embodiment, the method further comprises forming a thermal oxide portion containing a thermal oxide of the second silicon containing material directly on an entirety of the second sidewall concurrently with the expanding of the gate dielectric, wherein the expanded gate dielectric and the thermal oxide portion are integrally formed and are free of an interface therebetween.

In another embodiment, the method further comprises forming another thermal oxide portion containing a thermal oxide of the first silicon containing material having a substantially constant thickness and vertically abutting the semiconductor substrate concurrently with the expanding of the gate dielectric, wherein the thermal oxide portion and the another thermal oxide portion are integrally formed and free of an interface therebetween.

In yet another embodiment, a vertical thickness of the thermally oxidized gate dielectric monotonically increases from the first sidewall to the second sidewall.

In still another embodiment, the expanding of the gate dielectric converts a portion of the semiconductor substrate and a portion of the gate electrode by lateral diffusion of oxygen atoms from a portion of the gate dielectric directly beneath the second sidewall and subsequent reaction with the portion of the semiconductor substrate and the portion of the gate electrode.

In still yet another embodiment, the method further comprises forming a cavity between the gate dielectric and the gate electrode by removing a portion of the gate electrode beneath the second sidewall.

In a further embodiment, the method further comprises:

forming a first gate electrode layer comprising a semiconductor material on the semiconductor substrate;

implanting dopants into a portion of the first gate electrode layer to form a disposable semiconductor material portion;

forming a second gate electrode layer comprising the second silicon containing material directly on the disposable semiconductor material portion;

forming the gate electrode by patterning the first gate electrode layer, the disposable semiconductor material portion, and the second gate electrode layer; and removing a portion of the disposable semiconductor material portion from the gate electrode.

In an even further embodiment, the method further comprises:

forming a first conductivity type well having a doping of a first conductivity type, abutting the gate dielectric, and located underneath the first sidewall and in the semiconductor substrate;

forming a drift region having a doping of a second conductivity type, abutting the gate dielectric, and located underneath the second sidewall and in the semiconductor substrate, wherein the second conductivity type is the opposite of the first conductivity type.

forming a source region having a doping of the second conductivity type and located in the first conductivity type well; and forming a drain region having a doping of the second conductivity type and located in the drift region.

DETAILED DESCRIPTION OF THE INVENTION

Figure 1:
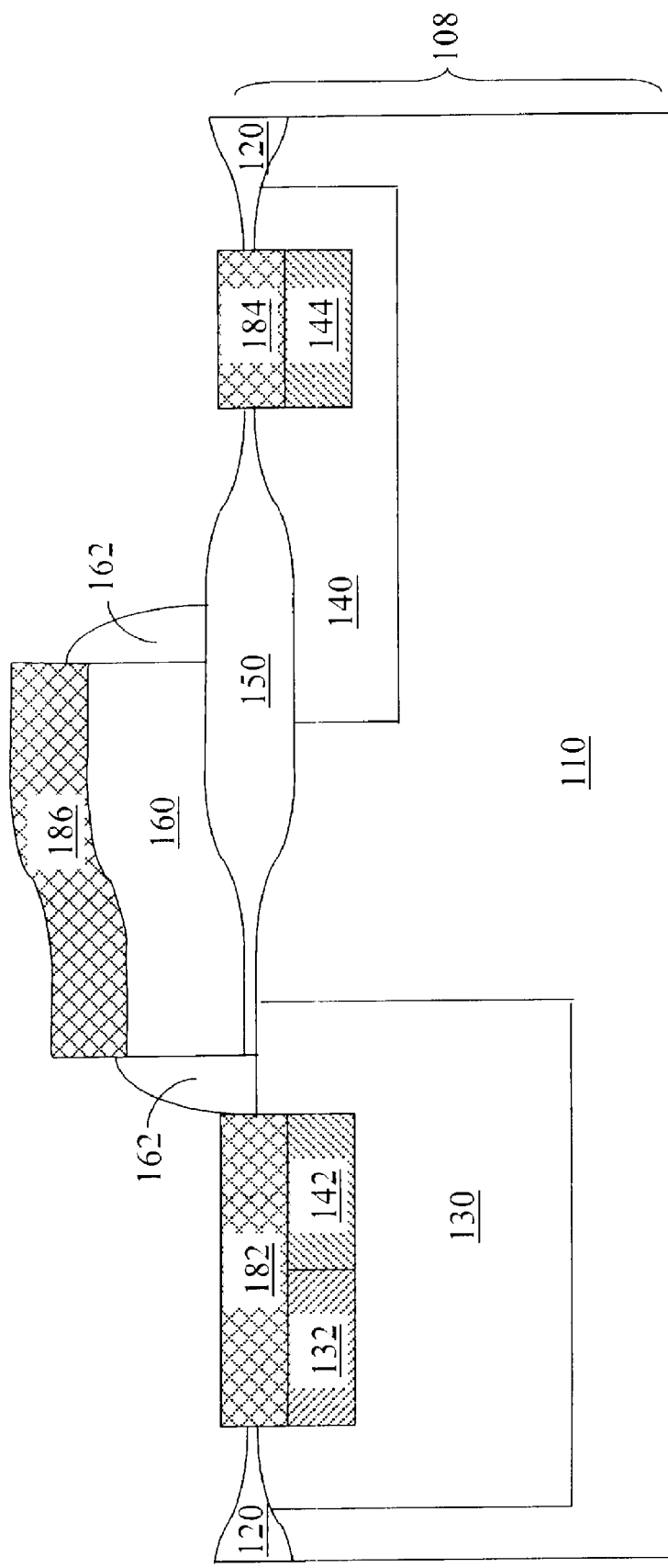
FIG. 1 is a vertical cross-sectional view of a first exemplary prior art lateral diffusion metal-oxide-semiconductor field effect transistor (LDMOSFET) employing a LOCOS oxide for the gate dielectric.
Figure 2:
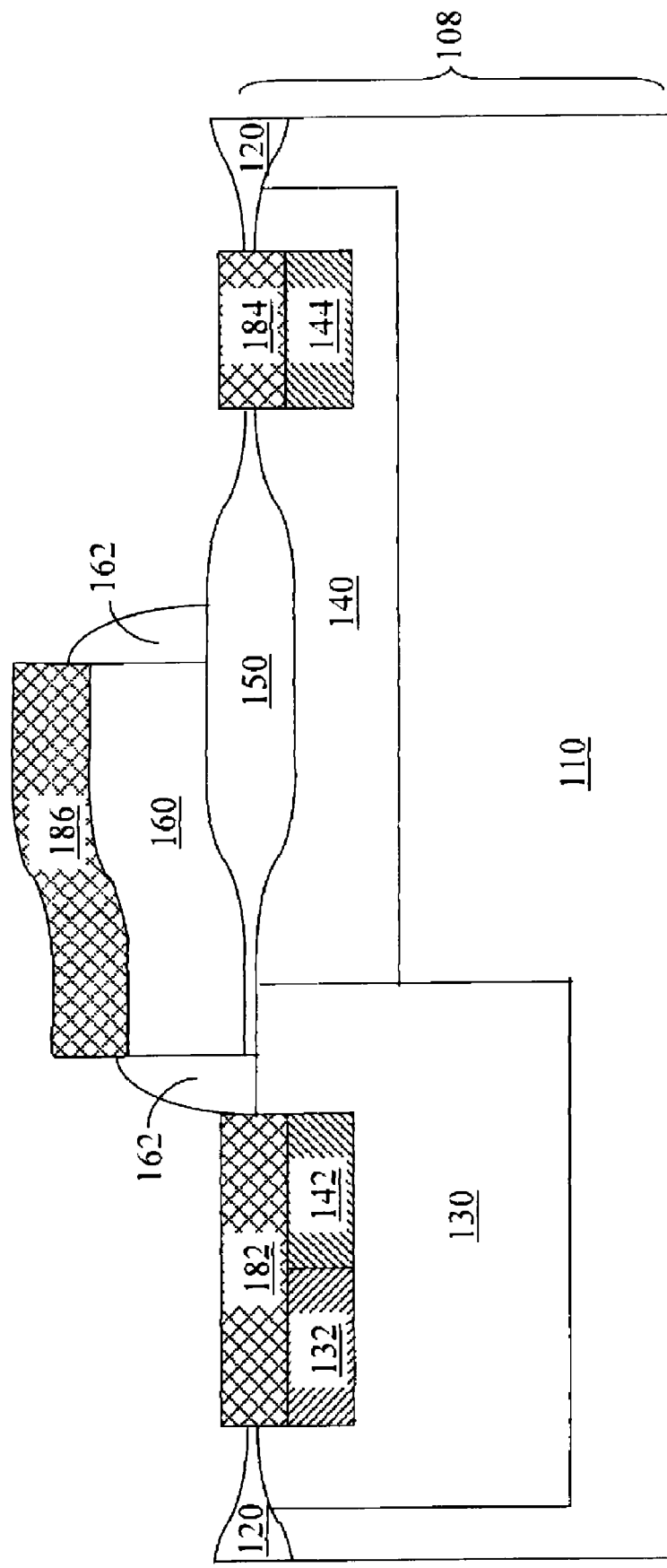
FIG. 2 is a vertical cross-sectional view of a second exemplary prior art lateral diffusion metal-oxide-semiconductor field effect transistor (LDMOSFET), which is a reduced surface field metal-oxide-semiconductor field effect transistor, in which a LOCOS oxide is employed for the gate dielectric.

As stated above, the present invention relates to lateral diffusion metal-oxide-semiconductor field effect transistors (LDMOSFETs) having an asymmetric gate dielectric and methods of manufacturing the same, which are now described in detail with accompanying figures. It is noted that like and corresponding elements are referred to by like reference numerals.

Figure 3:
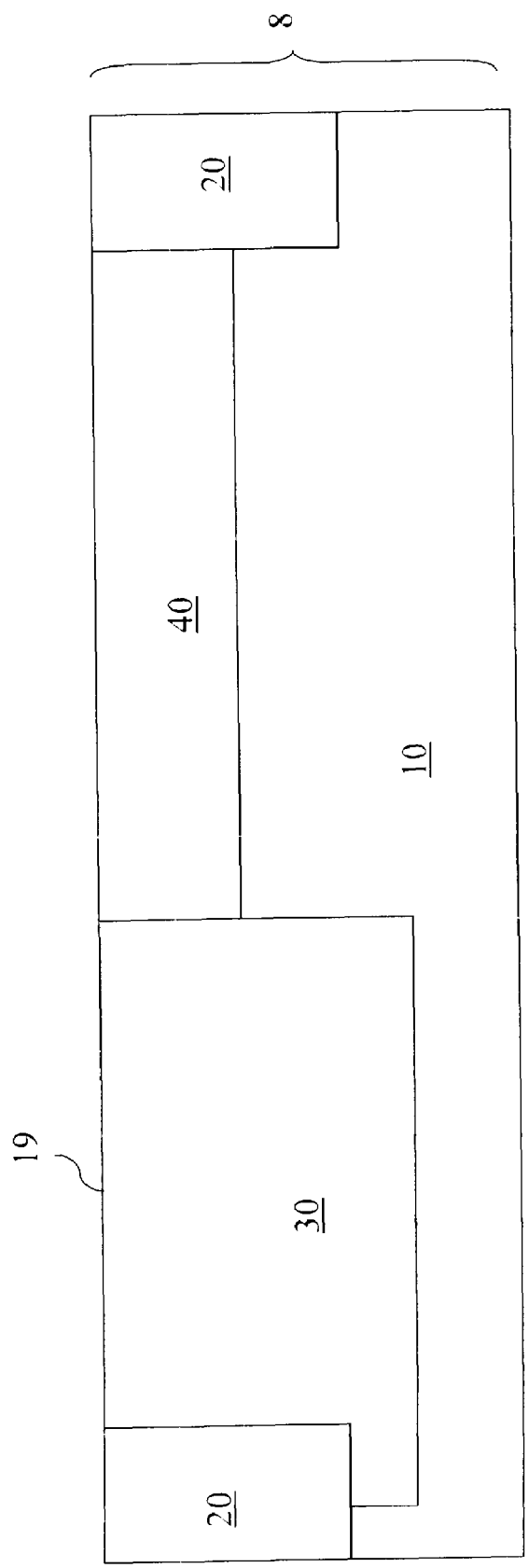
FIGS. 3-11 are sequential vertical cross-sectional views of a first exemplary semiconductor structure according to a first embodiment of the present invention.

Referring to FIG. 3, a first exemplary structure according to a first embodiment of the present invention comprises a semiconductor substrate 8 containing a substrate semiconductor region 10 and shallow trench isolation regions 20. The substrate semiconductor region 10 comprises a first silicon containing material such as silicon, a silicon germanium alloy, a silicon carbon alloy, or a silicon germanium carbon alloy. The substrate semiconductor region 10 may have a p-type doping or an n-type doping at a typical dopant concentration from about $1.0 \times 10^{14}/cm^3$ to about $1.0 \times 10^{16}/cm^3$. The doping type of the substrate semiconductor region 10 is herein referred to as a first conductivity type. The shallow trench isolation regions 20 comprise a dielectric material, and is formed by methods well known in the art.

A first conductivity type well 30 having a doping of the first conductivity type and a drift region 40 having a doping of a second conductivity type, which is the opposite of the first conductivity type, are formed directly beneath a top surface 19 in the semiconductor substrate 8. For example, the first conductivity type may be p-type and the second conductivity type may be n-type, or vice versa. The first conductivity type well 30 and the drift region 40 comprise the first silicon containing material, i.e., the same semiconductor material as the substrate semiconductor region 10. The first conductivity type well 30 has a dopant concentration from about $1.0 \times 10^{16}/cm^3$ to about $3.0 \times 10^{18}/cm^3$, and typically from about $3.0 \times 10^{16}/cm^3$ to about $1.0 \times 10^{18}/cm^3$, although lesser and greater dopant concentrations are also contemplated herein. Similarly, the drift region has a dopant concentration from about $1.0 \times 10^{16}/cm^3$ to about $3.0 \times 10^{18}/cm^3$, and typically from about $3.0 \times 10^{16}/cm^3$ to about $1.0 \times 10^{18}/cm^3$, although lesser and greater dopant concentrations are also contemplated herein. Preferably, the dopant concentration of the first conductivity type well 30 is greater than the dopant concentration of the substrate semiconductor region 10. The first conductivity type well 30 laterally abuts the drift region 40. The depth of the first conductivity type well 30 may be greater than, or may be substantially the same as, the depth of the drift region 40. Typically, the depths of the first conductivity type region 30 and the drift region 40 are from about 100 nm to about 1,000 nm.

Figure 4:
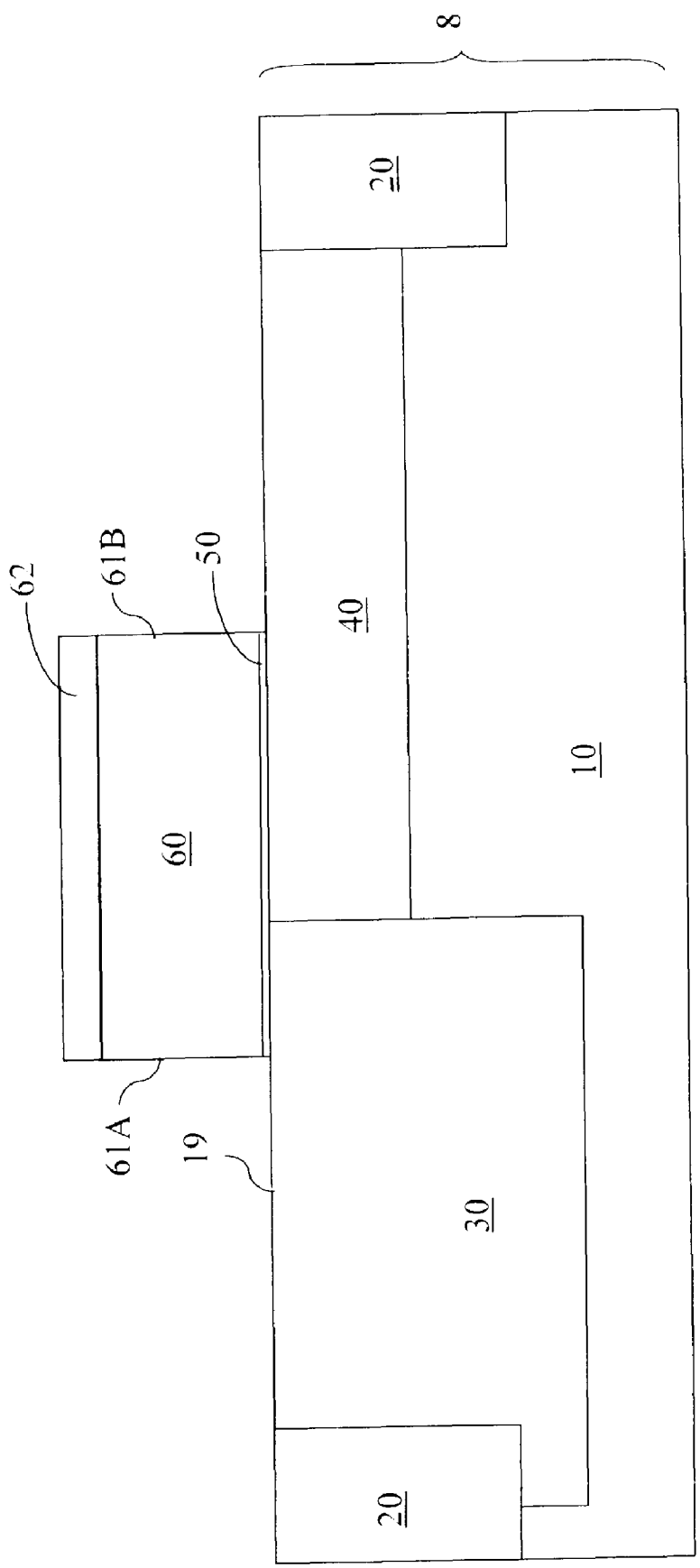

Referring to FIG. 4, a gate stack comprising a gate dielectric 50, a gate electrode 60, and a gate cap 62 are formed straddling the first conductivity type region 30 and the drift region 40. The gate dielectric 50 comprises a silicon oxide containing dielectric material, i.e., a dielectric material containing silicon oxide. The silicon oxide containing dielectric material may be silicon oxide, silicon nitride, or a stack of silicon oxide and a high-k gate dielectric material such as $HfO_2$, $ZrO_2$, $La_2O_3$, $Al_2O_3$, $TiO_2$, $SrTiO_3$, $LaAlO_3$, $Y_2O_3$, an alloy thereof, or a silicate thereof. The gate dielectric 50 has a uniform thickness at this point. The thickness of the gate dielectric may be from about 1 nm to about 50 nm, and preferably from about 6 nm to about 20 nm, although lesser and greater thicknesses are also explicitly contemplated herein.

The gate electrode 60 comprises a second silicon containing material such as polysilicon, amorphous silicon, a polycrystalline silicon germanium alloy, a polycrystalline silicon carbon alloy, or a polycrystalline silicon germanium carbon alloy. The gate electrode 60 may be doped with dopants of the first conductivity type or the second conductivity type. The gate electrode has a first sidewall above the first conductivity type well 30, which is herein referred to as a source side sidewall 61A, and a second sidewall above the drift region 40, which is herein referred to as a drain side sidewall 61B. The thickness of the gate electrode 60 may be from about 60 nm to about 400 nm, and preferably from about 100 nm to about 300 nm.

The gate cap 62 comprises an oxygen-diffusion-resistant material such as silicon nitride. The gate cap 62 prevents oxidation of the top portion of the gate electrode 60 by blocking oxygen atoms from the top surface of the gate electrode 60 in a subsequent thermal oxidation step. The thickness of the gate cap 62 may be from 10 nm to about 150 nm, and typically from about 30 nm to about 100 nm, although lesser and greater thicknesses are also explicitly contemplated herein.

Figure 5:
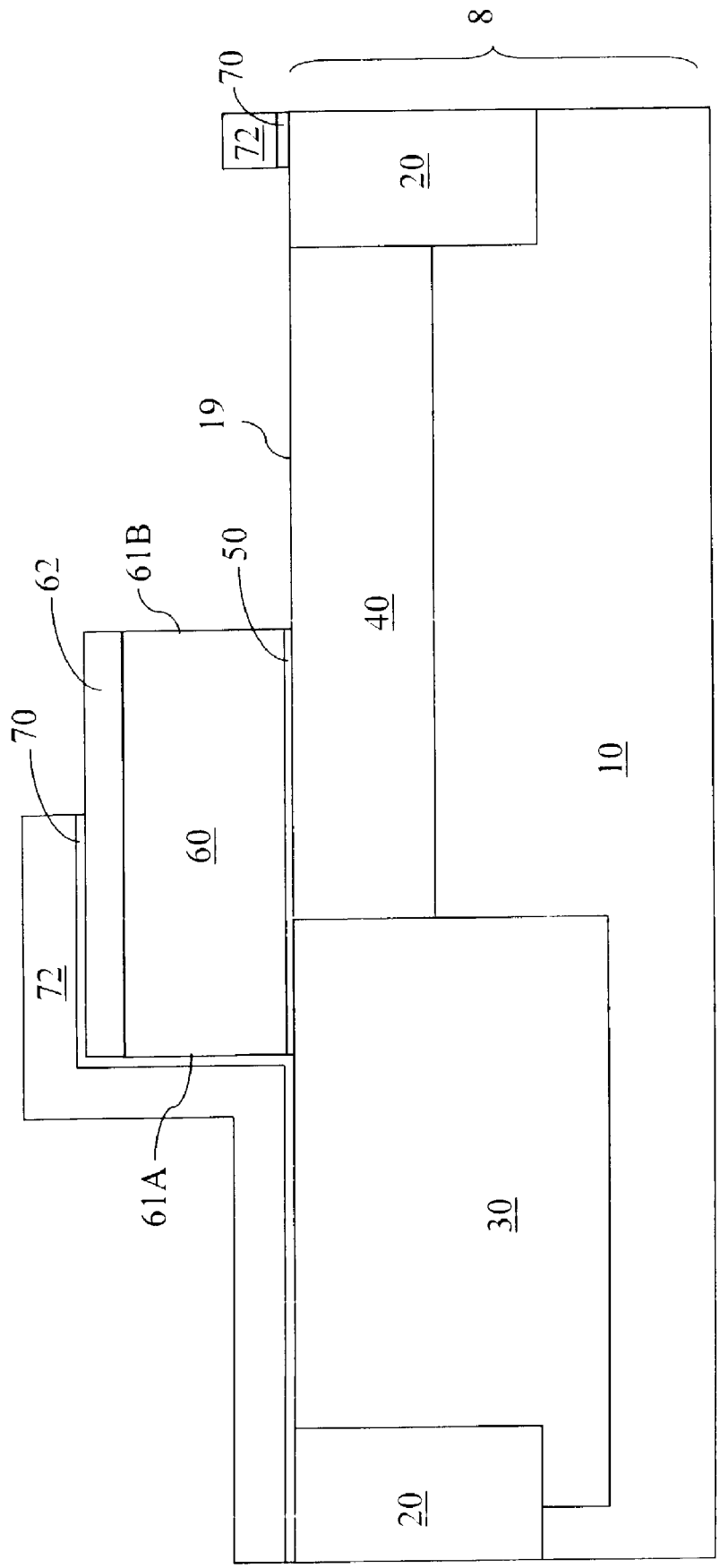

Referring to FIG. 5, a pad layer 70 and an oxygen-diffusion-resistant layer 72 are formed on the first conductivity type well region 30, the source side sidewall 61A, and optionally on a portion of the gate cap 62 adjoined to the source side sidewall 61A. The drift region 40, the drain side sidewall 61B, and another portion of the gate cap 62 adjoined to the drain side sidewall 61B are exposed. Such an arrangement may be effected by formation of the pad layer 70 and the oxygen-diffusion-resistant layer 72 over the entirety of the first exemplary semiconductor structure followed by lithographic patterning and etching of the pad layer 70 and the oxygen-diffusion-resistant layer 72 over the drift region 40, the drain side sidewall 61B, and the another portion of the gate cap 62. An edge of the stack of the pad layer 70 and the oxygen-diffusion-resistant layer 72 is located above a portion of the shallow trench isolation regions 20 that is located adjacent to the drift region 40.

The pad layer 70 may comprise a silicon oxide such as a thermal silicon oxide or a doped or undoped silicate glass formed by chemical vapor deposition (CVD). The pad layer 70 enhances adhesion between underlying layers and the oxygen-diffusion-resistant layer 72. The pad layer 70 is optional, i.e., may, or may not, be omitted from the first exemplary semiconductor structure. The thickness of the pad layer 70 may be from about 1 nm to about 50 nm. The thickness of the oxygen-diffusion-resistant layer 72 may be from 10 nm to about 150 nm, and typically from about 30 nm to about 100 nm, although lesser and greater thicknesses are also explicitly contemplated herein.

Figure 6:
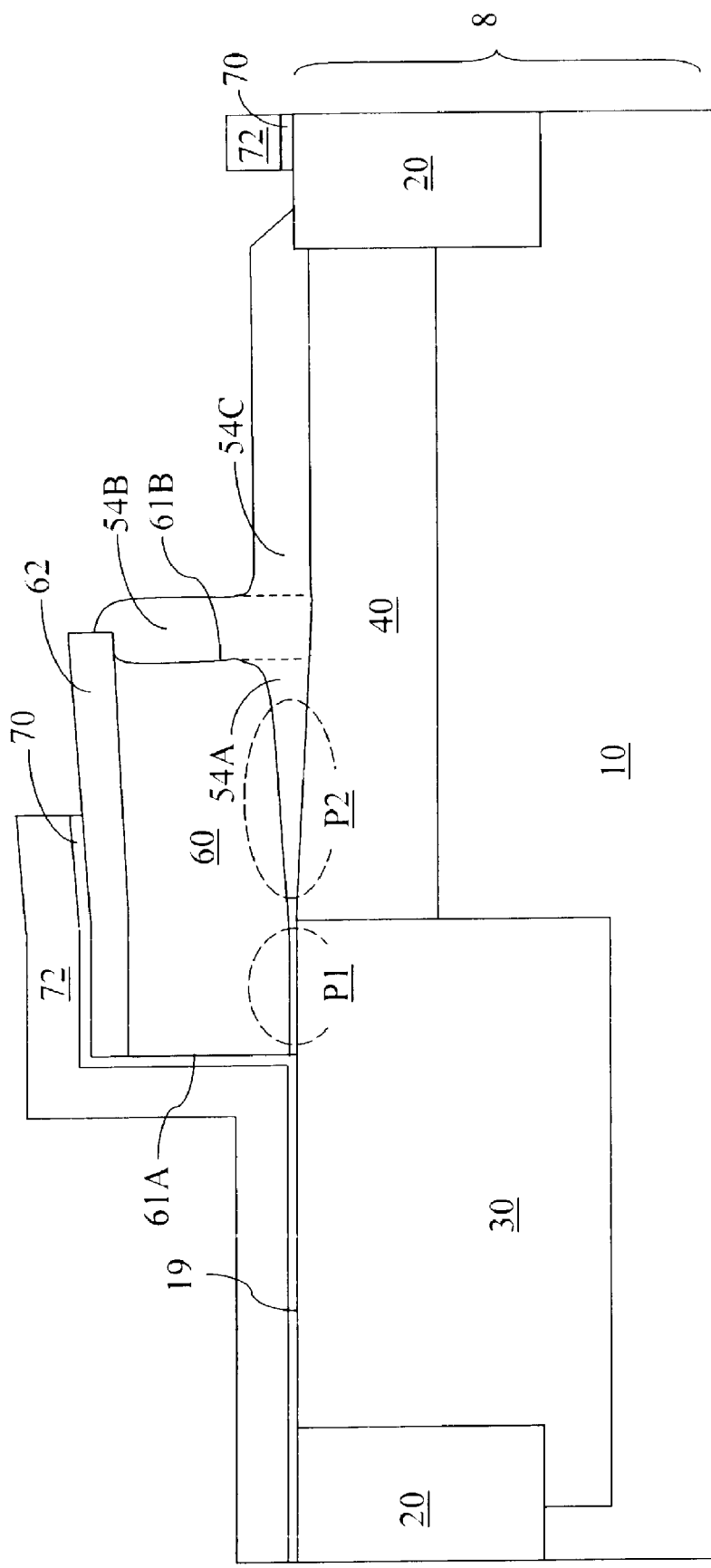

Referring to FIG. 6, a thermal oxidation is performed on the first exemplary semiconductor structure to expand the gate dielectric 50 (See FIG. 5), the drain side sidewall 61B and on, while preventing oxidation of the source side sidewall 61A. The expansion of the gate dielectric 50 is effected by converting a portion of the drift region 40, which is in the semiconductor substrate 8, and a portion of the gate electrode 60 into a silicon oxide containing dielectric material. Oxygen atoms supplied from a source gas containing $O_2$ and/or $H_2O$ laterally diffuse from a portion of the gate dielectric 50 directly beneath the second drain side sidewall 61B to an interface between the gate dielectric and a bottom surface of the gate electrode 50 or a top surface of the drift region underneath the gate electrode 60. The oxygen atoms subsequently react with the first silicon containing material of the portion of the drift region 40 and second silicon containing material of the portion of the gate electrode 60 to form the silicon oxide containing dielectric material. In case the first silicon containing material is silicon, the portion of the silicon oxide containing material derived from the portion of the drift region 40 is silicon oxide. In case the second silicon containing material is silicon, the portion of the silicon oxide containing material derived from the portion of the gate electrode 60 is silicon oxide. In case the first or second silicon containing material comprises a silicon germanium alloy, a silicon carbon alloy, or a silicon germanium carbon alloy, the silicon oxide containing material may comprise a mixture of silicon oxide and germanium oxide, a carbon containing silicon oxide, or a mixture of silicon oxide, germanium oxide, and carbon.

The gate dielectric 50 as expanded by the thermal oxidation process is herein referred to as an expanded gate dielectric 54A to denote the aspect of volume expansion. The expanded gate dielectric 54A has a graded thickness which increases monotonically from the source side sidewall 61A to the drain side sidewall 61B. The thickness of the expanded gate dielectric near the source side sidewall is substantially the same as before the thermal oxidation processing step since the oxygen-diffusion-resistant layer 72 prevents oxidation of the source side sidewall 61A or any increase in the thickness of the gate dielectric 50 directly beneath the source side sidewall 61A. Further, supply of the oxygen atoms diffusing from underneath the drain side sidewall 61B is negligible since most of the diffusing oxygen atoms are consumed before reaching the portion of the gate dielectric 50 directly beneath the source side sidewall 61A.

The thermal oxidation processing step also forms a thermal oxide portion 54B containing a thermal oxide of the second silicon containing material directly on an entirety of the drain side sidewall 61B concurrently with the expansion of the gate dielectric 50 to form the expanded gate dielectric 54A. The thermal oxide portion 54B is formed by converting the second silicon containing material under the surface of the drain side sidewall 61A. During the thermal oxidation processing step, the drain side sidewall 61A of the gate electrode 60 moves inward toward the first conductivity type well 30 as the second silicon containing material is consumed from the gate electrode 60. The expanded gate dielectric 54A and the thermal oxide portion 54B are integrally formed and are free of an interface therebetween.

Further, the thermal oxidation processing step forms another thermal oxide portion 54C containing a thermal oxide of the first silicon containing material having a substantially constant thickness concurrently with the expansion of the gate dielectric 50. The another thermal oxide portion 54C is formed by thermal conversion of the first silicon containing material in an exposed surface of the drift region 40, which is located in the semiconductor substrate 8. The another thermal oxide portion 54C vertically abuts the drift region 40. The thermal oxide portion 54B and the another thermal oxide portion 54C are integrally formed and free of an interface therebetween. Thus, the expanded gate dielectric 54A, the thermal oxide portion 54B, and the another thermal oxide portion 54C are of unitary and integral construction, i.e., formed as one piece without any physical boundary therebetween.

The expanded gate dielectric 54A comprises a first portion P1 having a substantially constant thickness and adjoining the source side sidewall 61A and a second portion P2 having a constantly increasing thickness, adjoining the drain side sidewall 61B, and having a substantially constant rate of increase in thickness per lateral length. The thickness of the expanded gate dielectric 54A near the drain side sidewall 61B may be greater than the thickness of the first portion by a percentage from about 10% to about 500% of the thickness of the first portion. Typically, the thickness of the expanded gate dielectric 54A near the drain side sidewall 61B is from about 20 nm to about 150 nm, and preferably from about 30 nm to about 80 nm, although lesser and greater thicknesses are also contemplated herein.

Figure 7:
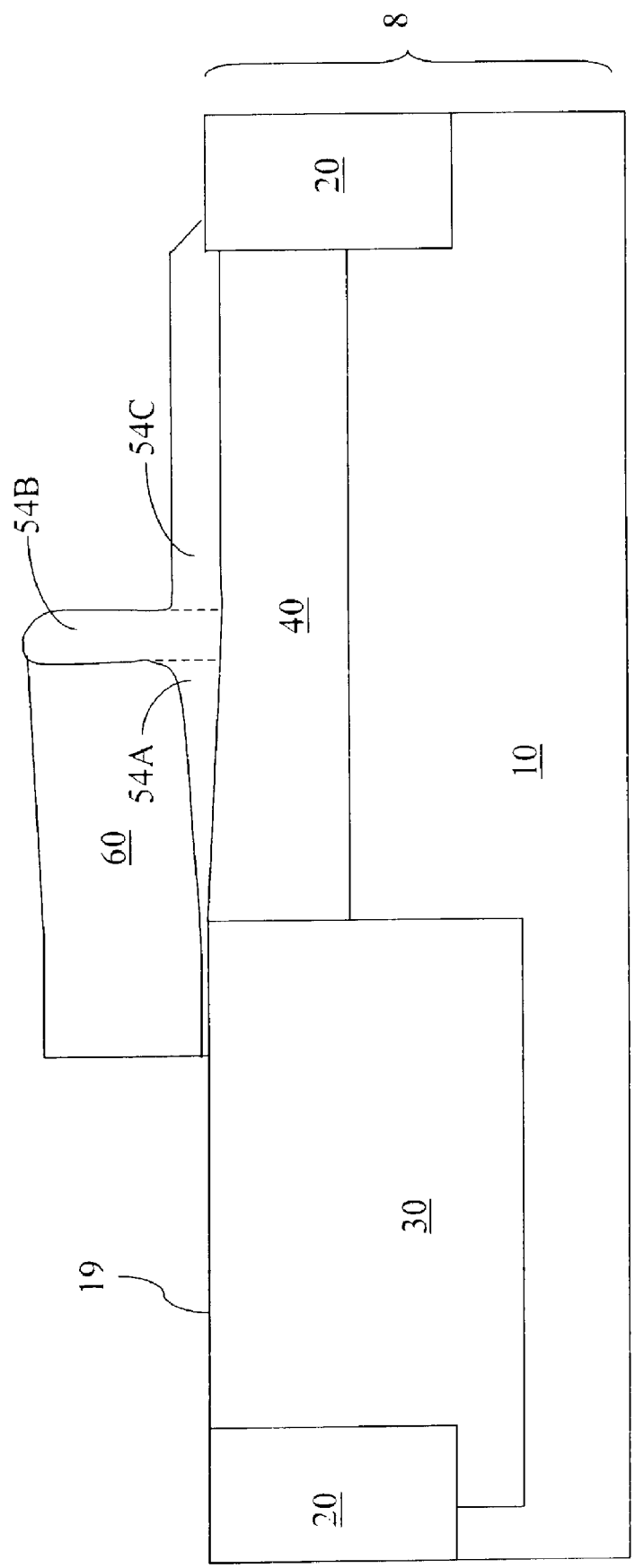

Referring to FIG. 7, the pad layer 70 and the oxygen-diffusion-resistant layer 72 are removed, for example, by a wet etch. In case the oxygen-diffusion-resistant layer 72 comprises silicon nitride 72, a wet etch employing hot phosphoric acid may be employed. In case the pad layer 70 comprises silicon oxide, some material may be removed from the thermal oxide portion 54B and the another thermal oxide portion 54C during the removal of the pad layer 70.

Figure 8:
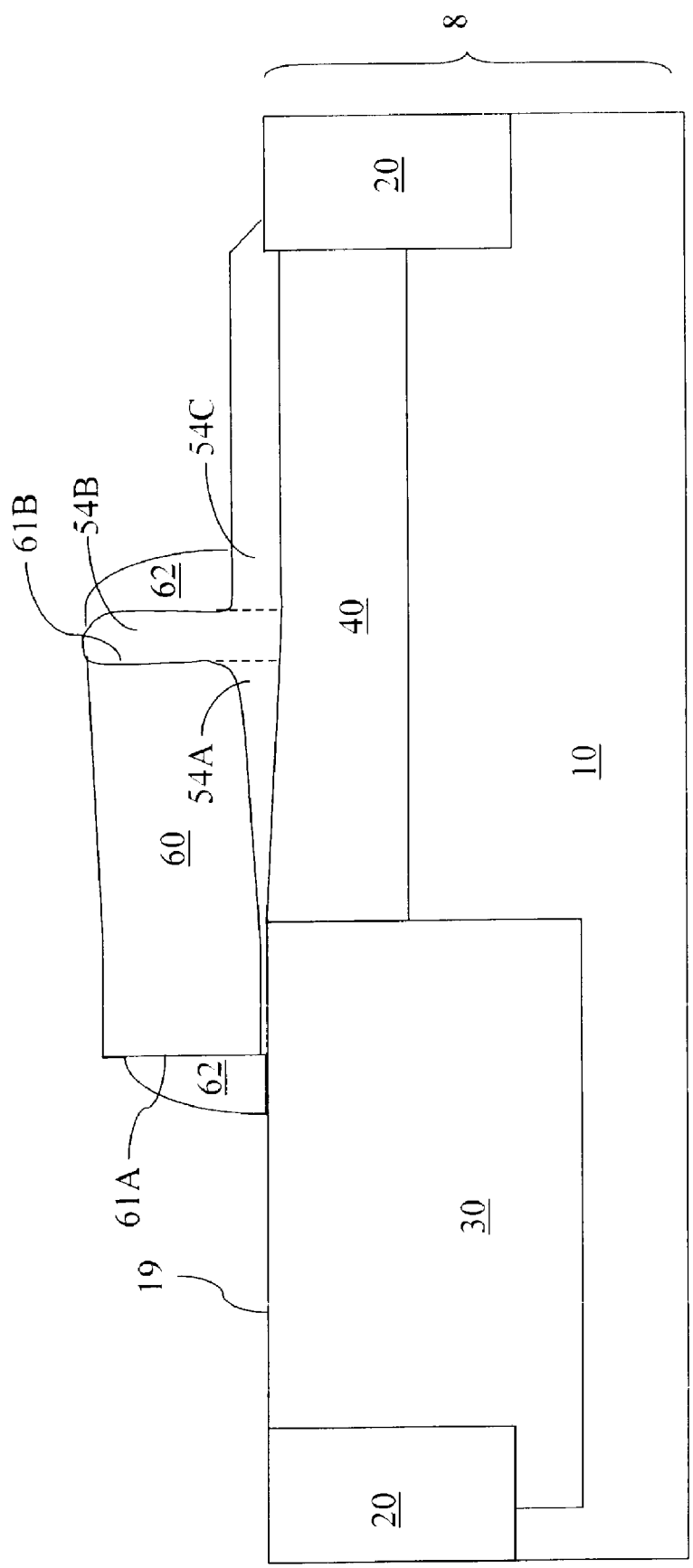

Referring to FIG. 8, a gate spacer 62 is formed by a conformal deposition of a dielectric layer (not shown) followed by an anisotropic reactive ion etch. A portion of the gate spacer 62 is formed on the source side sidewall 61A and another portion of the gate spacer 62 is formed on an outer wall of the thermal oxide portion 54B.

Figure 9:
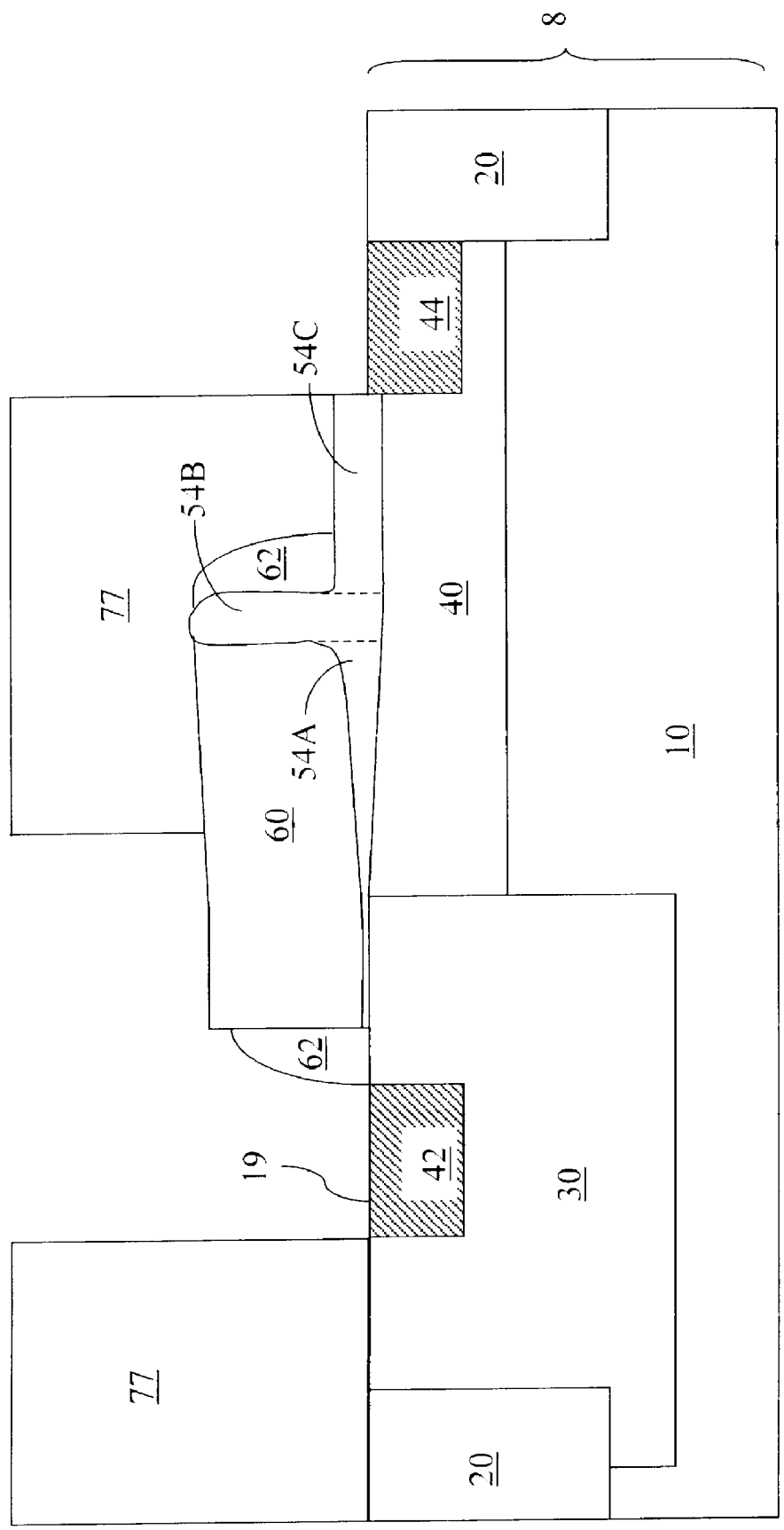

Referring to FIG. 9, a block level photoresist 77 is applied to the semiconductor substrate 8 and the gate electrode 60 and lithographically patterned to expose a portion in the first conductivity type well 30 and another portion in the drift region 40. An exposed portion of the another thermal oxide portion 54C may be etched by a reactive ion etch within an opening in the block level photoresist 77 above the drift region 40. Dopants of the second conductivity type are implanted into the exposed portions of the first conductivity type well 30 and the drift region 40 to form a source region 42 and a drain region 44, respectively. The depth of the source region 42 and the drain region 44 may be from about 30 nm to about 400 nm, and typically from about 100 nm to about 200 nm, although lesser and greater depths are also contemplated herein. Typically, the source region 42 and the drain region 44 are heavily doped, i.e., have a dopant concentration from about $3.0\times10^{19}/cm^3$ to about $3.0\times10^{21}/cm^3$. The block level photoresist 77 is subsequently removed.

Figure 10:
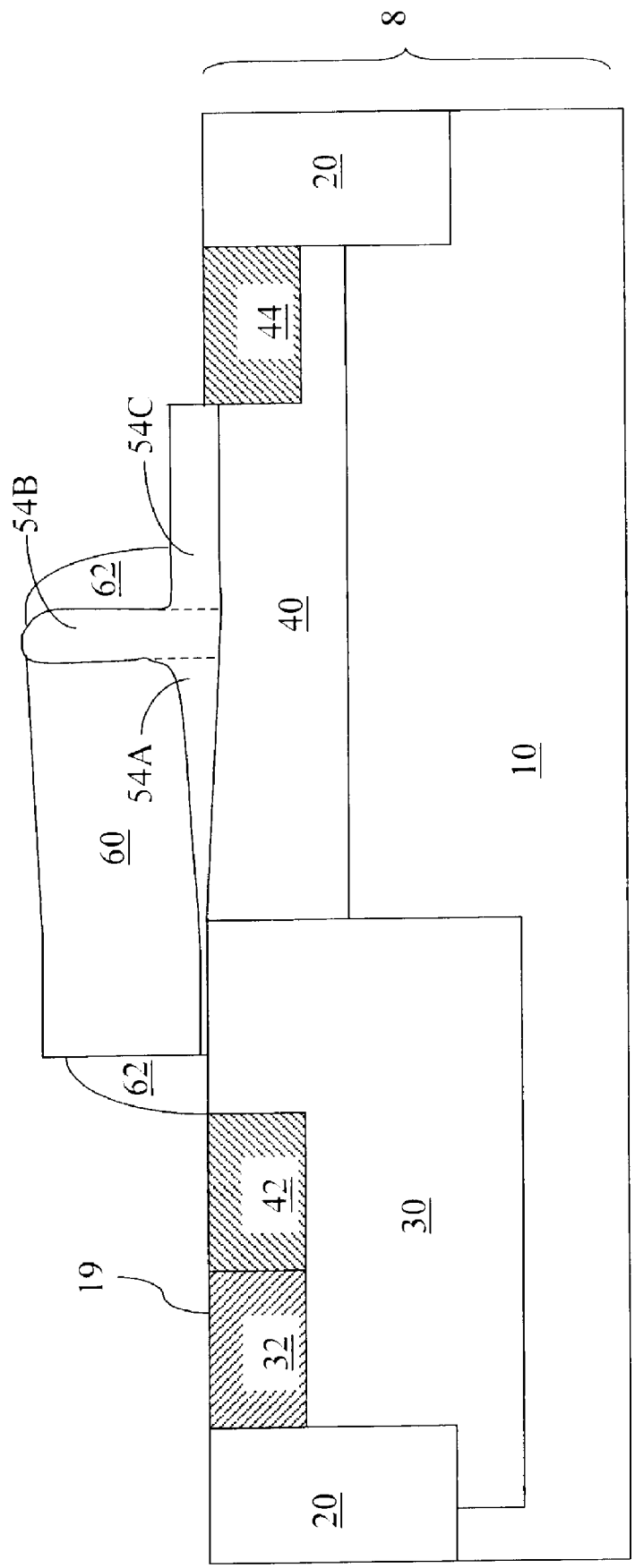

Referring to FIG. 10, a substrate contact semiconductor region 32 may be formed in the first conductivity type well 30 by a masked implantation of first conductivity type dopants during which the source region 42 and the drain region 44 are masked by another block level mask (not shown). The substrate contact semiconductor region 32 is heavily doped, i.e., has a dopant concentration from about $3.0\times10^{19}/cm^3$ to about $3.0\times10^{21}/cm^3$. The substrate contact semiconductor region 32 may, or may not, laterally abut the source region 42.

Figure 11:
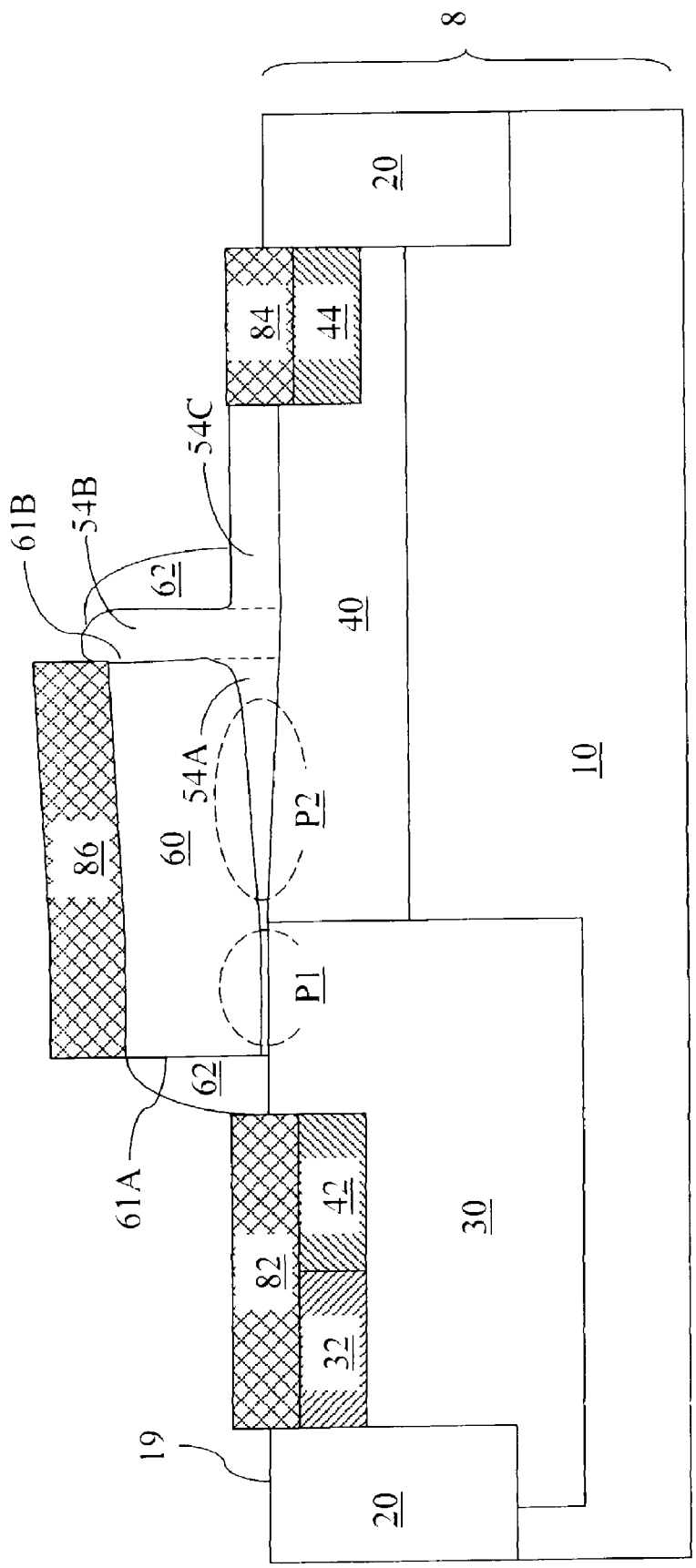

Referring to FIG. 11, various metal suicides are formed on exposed semiconductor surfaces. Specifically, a source and substrate metal contact 82 and a drain metal contact 84 comprising a silicide of the first silicon containing material are formed in the first conductivity type well 30 and in the drift region 40, respectively. A gate metal contact 86 comprising a silicide of the second silicon containing material are formed on the gate electrode 60. In case the first silicon containing material or the second silicon containing material is silicon, the silicide of the first or second silicon containing material is a metal silicide. In case the first silicon containing material or the second silicon containing material is a silicon containing alloy, the silicide of the first or second silicon containing material is an alloy or a compound containing a metal silicide.

The first exemplary semiconductor structure is a lateral diffusion metal oxide semiconductor field effect transistor (LDMOSFET) having a gate dielectric, which is the expanded gate dielectric 54, of a monotonically increasing thickness from the source side sidewall 61A to the drain side sidewall 61B. Mathematically, a monotonically increasing function may hold the same value or may increase with an increase in the value of a parameter. In the present invention, the thickness of the expanded gate dielectric 54A monotonically increases with the distance from the source side sidewall 61A to the point of measurement of the thickness of the expanded gate dielectric 54A. The expanded gate dielectric 54A contains a first portion P1 in which the thickness of the expanded gate dielectric 54A remains substantially the same, and a second portion P2 in which the thickness is strictly increasing. The rate of increase of the thickness of the expanded gate dielectric 54A may be substantially the same since the increase in thickness is limited by diffusion of oxygen atoms during the thermal oxidation step. The increased thickness on the drain side of the gate electrode 60 provides enhanced protection to the expanded gate dielectric 54A from a high drain voltage, while the thin first portion P1 directly above the first conductivity type region 30 provides enhanced electrical field in the first conductivity type region 30 to enhance the on-current of the inventive LDMOSFET.

Figure 12:
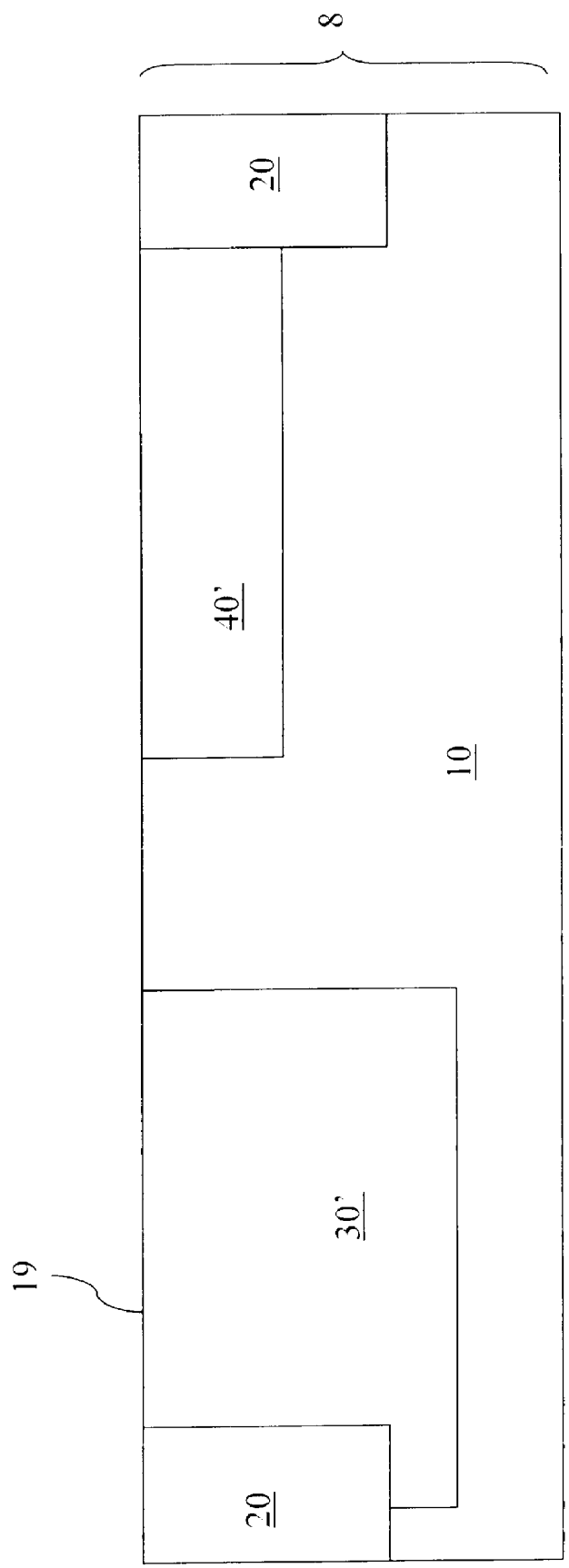
FIGS. 12-13 are vertical cross-sectional views of a variation of the first exemplary semiconductor structure.

Referring to FIG. 12, a variation of the first exemplary semiconductor structure comprises a first conductivity type well 30' and a drift region 40' that are separated from each other by a portion of the substrate semiconductor region 10. Other than the processing steps employed to form the first conductivity type well 30' and the drift region 40', the same processing steps may be employed as on the first exemplary semiconductor structure.

Figure 13:
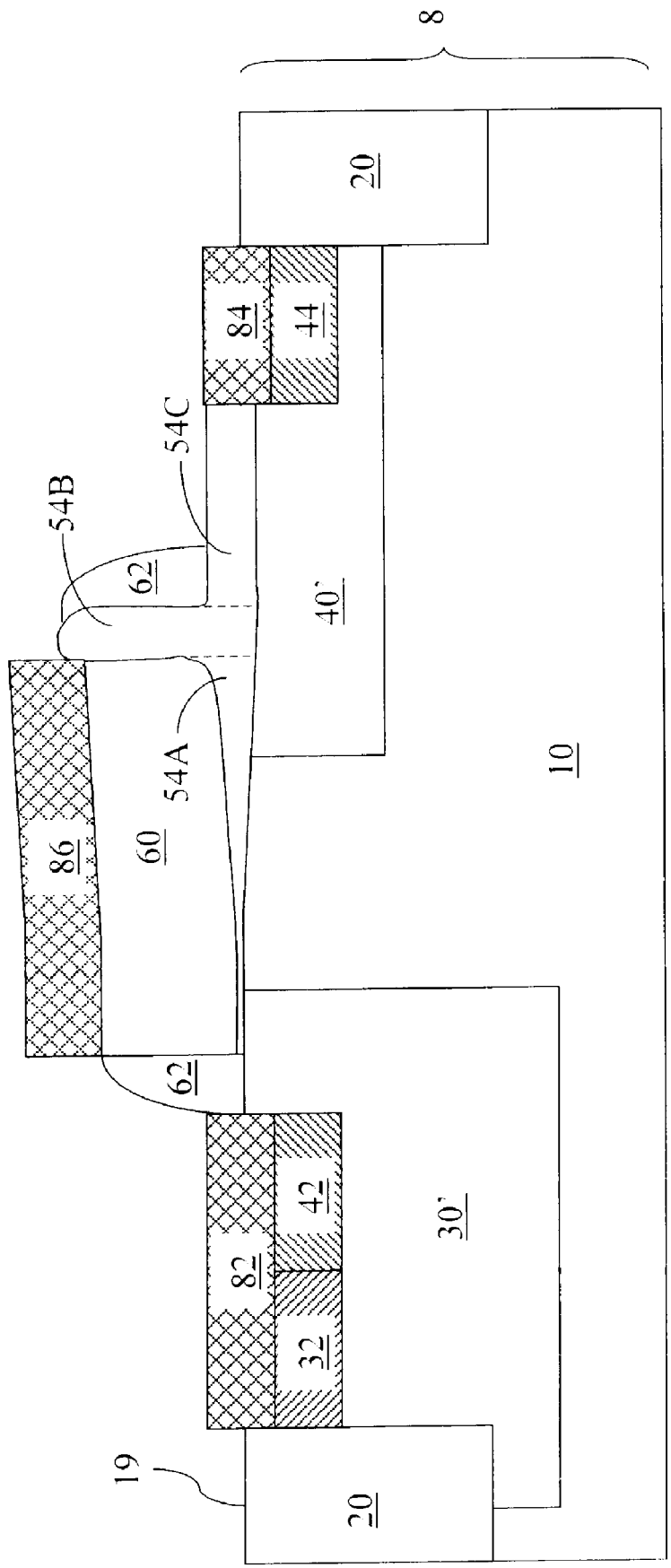

Referring to FIG. 13, the variation of the first exemplary semiconductor structure is shown at a processing step corresponding to FIG. 11. While both the first conductivity type well 30' and the substrate semiconductor region 10 are doped with dopants of the first conductivity type, the lower dopant concentration of the substrate semiconductor region 10 may be advantageously employed to provide an LDMOSFET capable of withstanding higher drain voltage.

Figure 14:
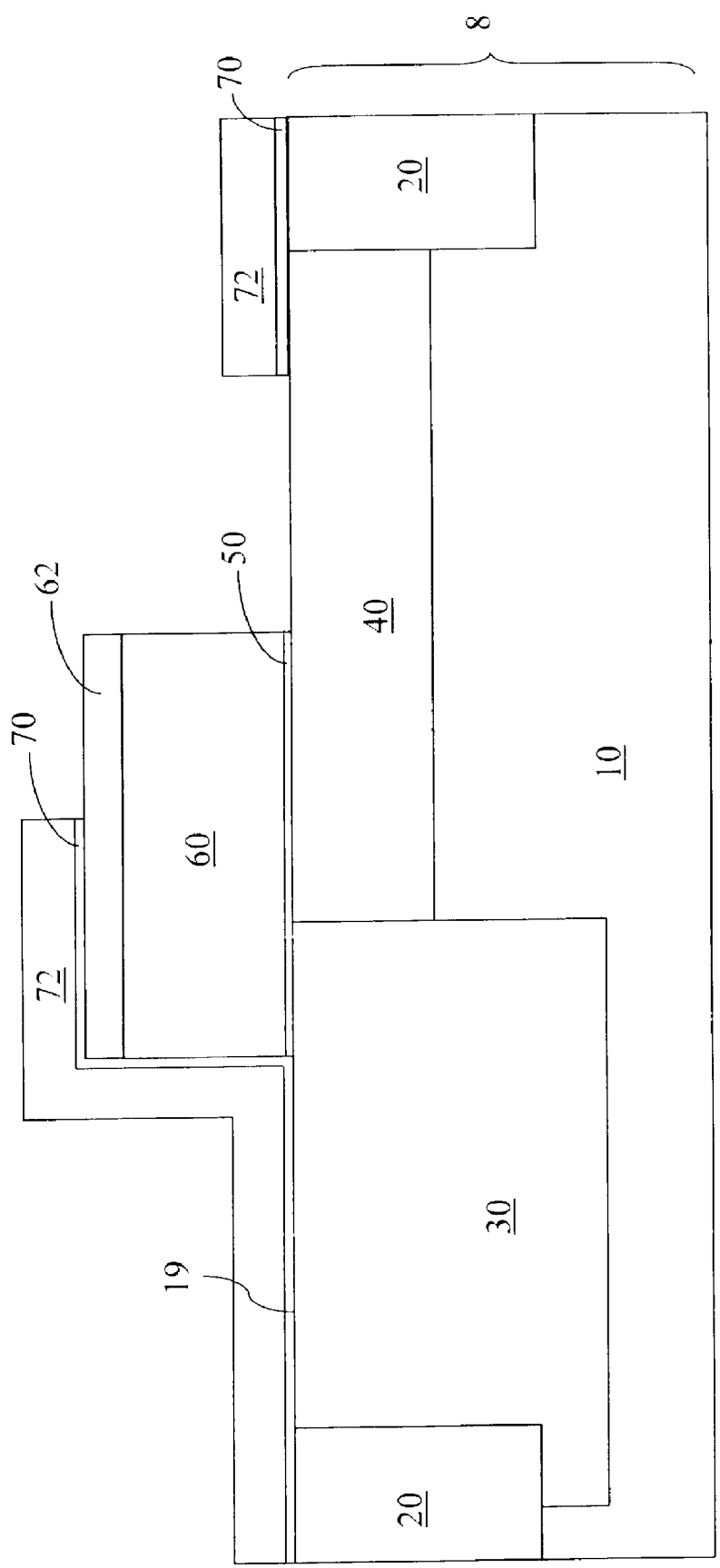
FIGS. 14-15 are vertical cross-sectional views of another variation of the first exemplary semiconductor structure.

Referring to FIG. 14, another variation of the first exemplary semiconductor structure is shown, in which an edge of the stack of the pad layer 70 and the oxygen-diffusion-resistant layer 72 is located directly above the drift region 40 at a processing step corresponding to FIG. 5.

Figure 15:
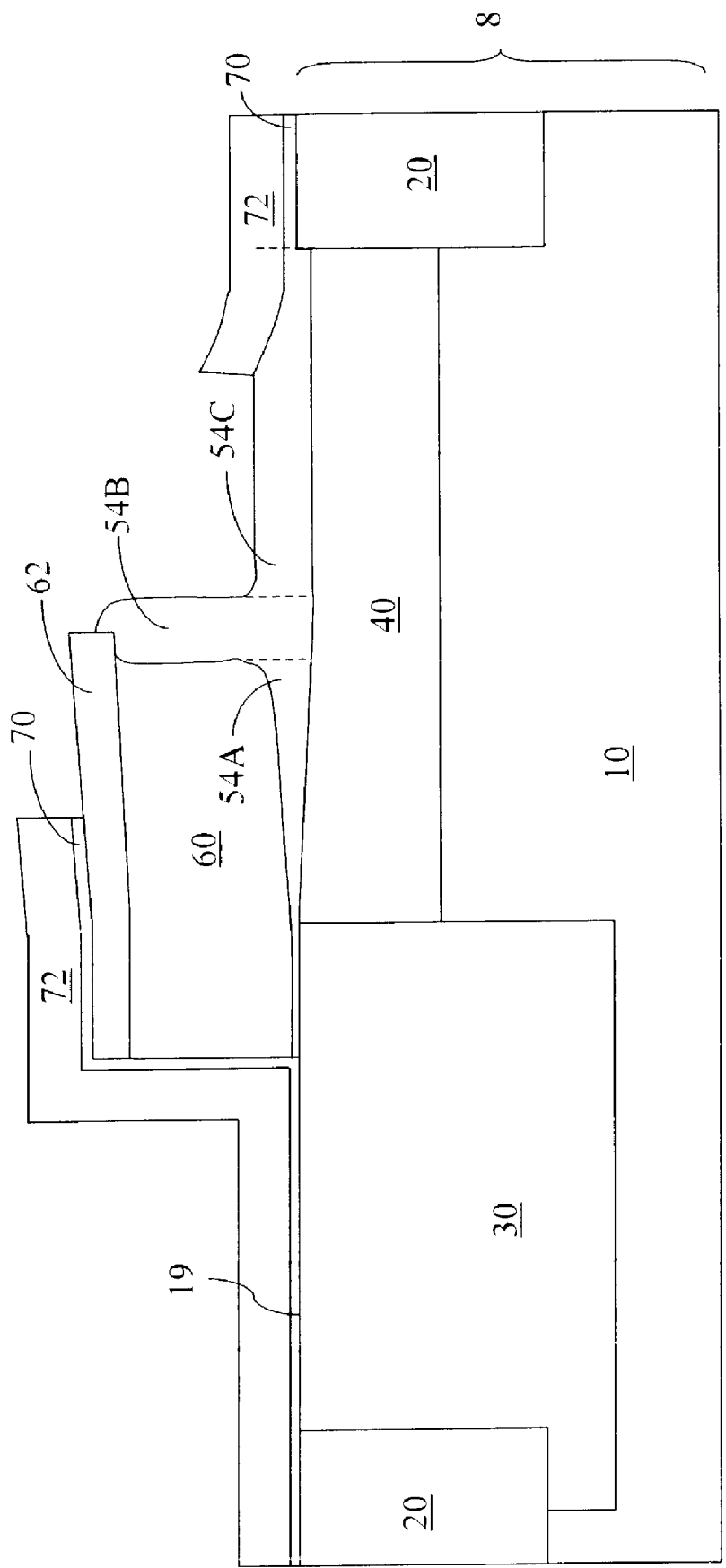

Referring to FIG. 15, the thickness of the another thermal oxide portion 54C decreases toward the boundary of the drift region 40 and a portion of the shallow trench isolation. The same processing steps are employed as on the first exemplary semiconductor to produce the structure of FIG. 11.

Figure 16:
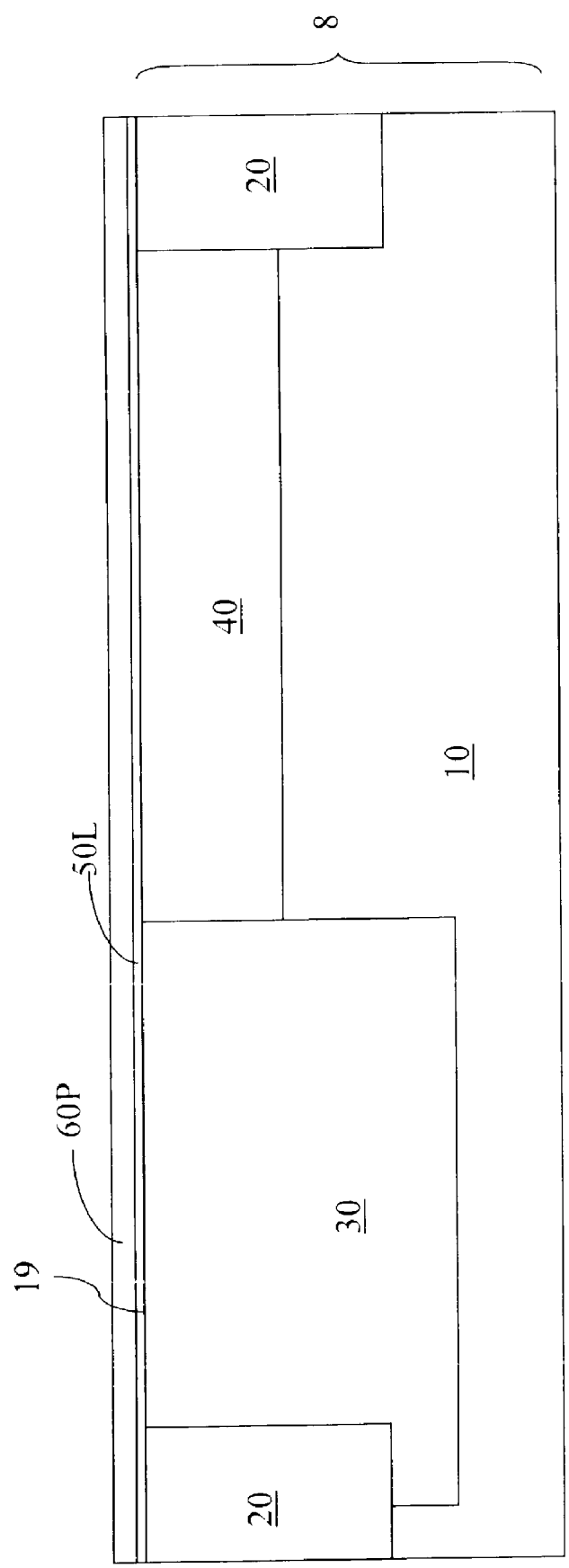
FIGS. 16-23 are sequential vertical cross-sectional views of a second exemplary semiconductor structure according to a second embodiment of the present invention.

Referring to FIG. 16, a second exemplary semiconductor structure according to a second embodiment of the present invention is derived from the first exemplary semiconductor structure in FIG. 3 by forming a gate dielectric layer 50L and a first gate electrode layer 60P on the semiconductor substrate 8. The gate dielectric layer 50L may have the same composition and thickness as the gate dielectric 50 in the first embodiment.

The first gate electrode layer 60P comprises a semiconductor material such a polysilicon, amorphous silicon, or a polycrystalline or amorphous silicon containing alloy. Preferably, the first gate electrode layer 60P is substantially undoped or doped at a medium or low dopant concentration level, i.e., at a dopant concentration less than $3.0 \times 10^{19}/cm^3$. The thickness of the first gate electrode layer 60P may be from about 3 nm to about 60 nm, and preferably from about 6 nm to about 30 nm, although lesser and greater thicknesses are also contemplated herein.

Figure 17:
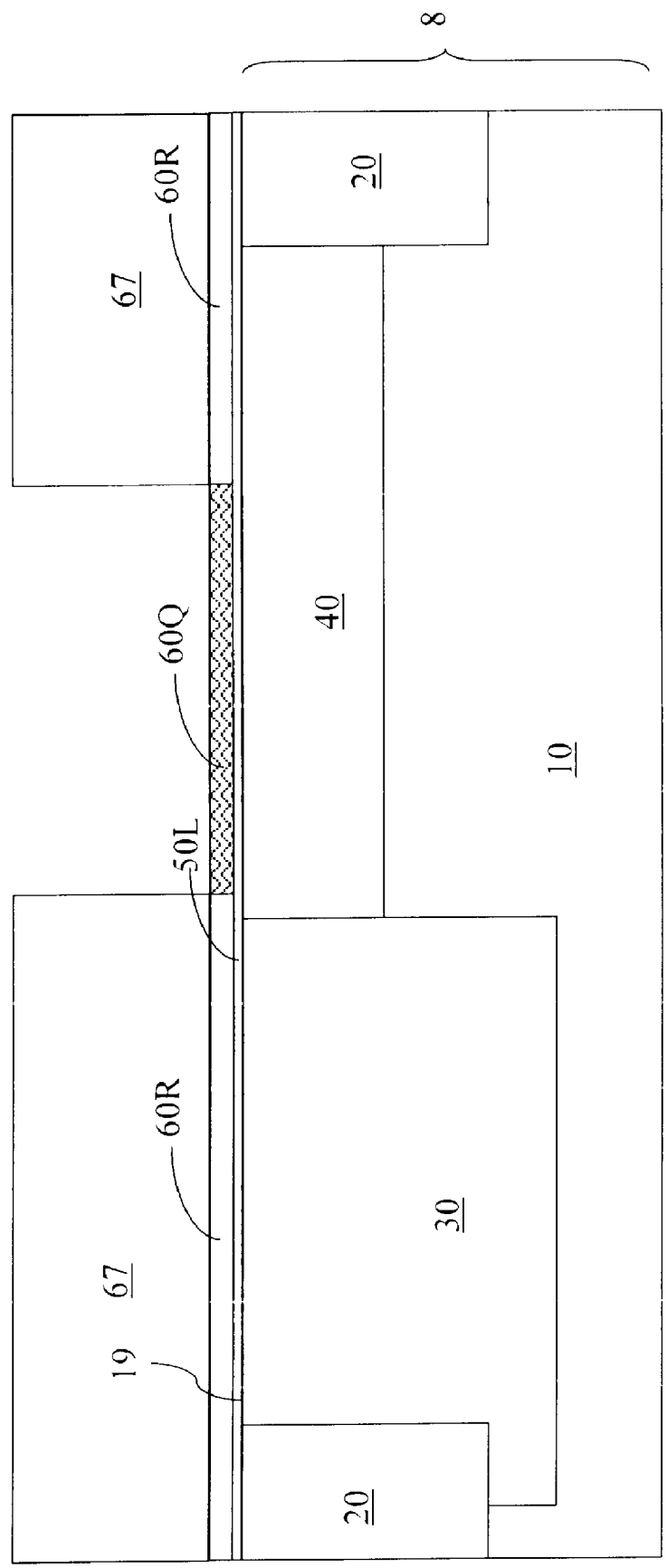

Referring to FIG. 17, a photoresist 67 is applier over the first gate electrode layer and lithographically patterned to form an opening. The exposed portion of the first gate electrode layer 60P is implanted to form a disposable semiconductor material portion 60Q. The dopant concentration of the disposable semiconductor material portion 60Q may be from about $1.0 \times 10^{20}/cm^3$ to about $5.0 \times 10^{21}/cm^3$, and preferably from about $1.0 \times 10^{20}/cm^3$ to about $5.0 \times 10^{21}/cm^3$. The disposable semiconductor material portion 60Q may be doped with p-type dopants or n-type dopants. The remaining portion of the first gate electrode layer 60P constitutes an unimplanted first gate electrode layer 60R.

Figure 18:
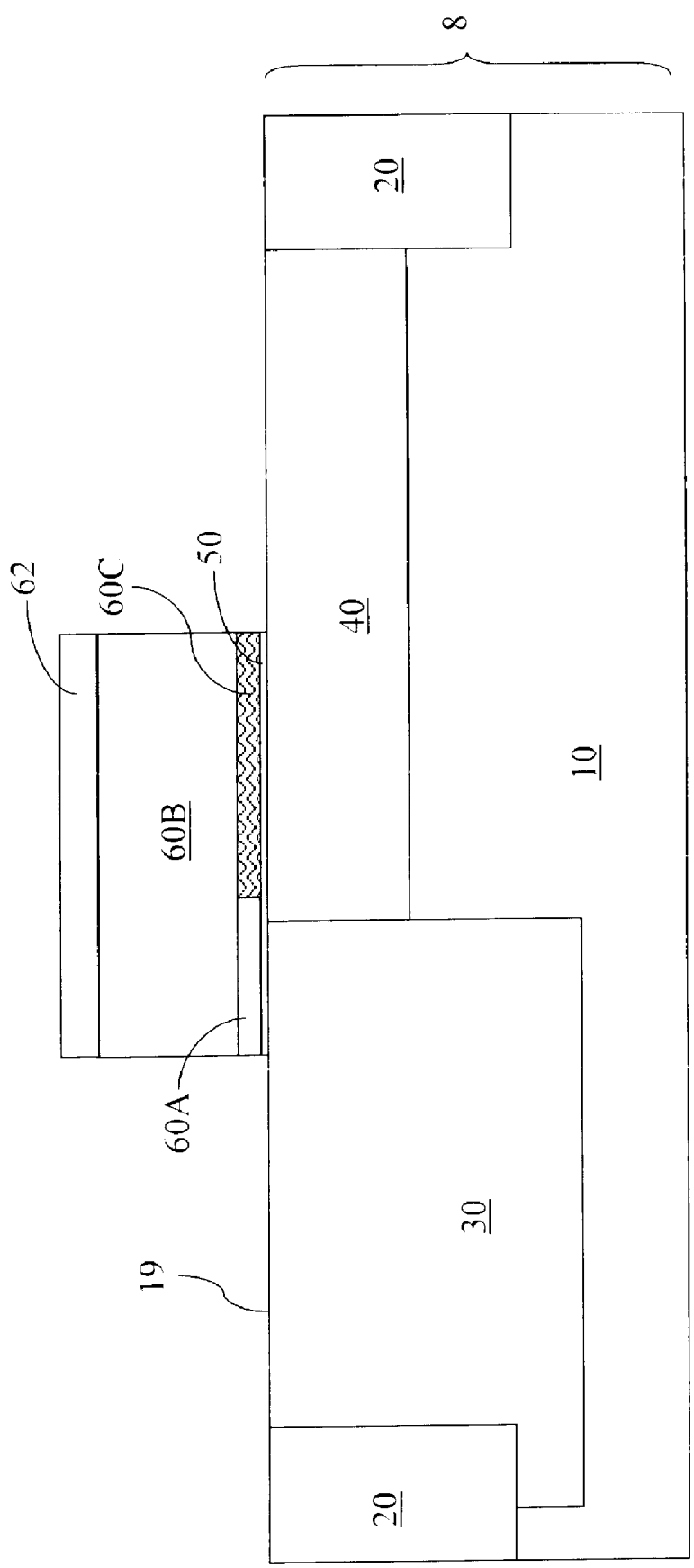

Referring to FIG. 18, a second gate electrode layer (not shown) comprising a second silicon containing material, which may comprise the material as the second silicon containing material in the first embodiment, is deposited, followed by deposition of a gate cap layer (not shown) comprising an oxide-diffusion-resistant material such as silicon nitride. Preferably, the second gate electrode layer comprises a different material than the disposable semiconductor material portion 60Q or has a doping concentration less than $3.0 \times 10^{19}/cm^3$ to subsequently enable an etch of the disposable semiconductor material portion 60Q selective to the material of the unimplanted first gate electrode layer 60R and the material of the second gate electrode layer. The gate cap layer has the same composition and thickness as the gate cap 62 in the first embodiment. The stack of layers above the top surface 19 of the semiconductor substrate 8 is patterned to form a gate stack comprising a gate dielectric 50, which is formed out of the gate dielectric layer 50L, a gate electrode, and a gate cap 62, which is formed out of the gate cap layer. The gate electrode comprises a first gate electrode portion 60A, which is formed out of the unimplanted first gate electrode layer 60R, a disposable gate electrode portion 60C, which is formed out of the disposable semiconductor material portion 60Q, and a second gate electrode portion 60B, which is formed out of the second gate electrode layer. The sum of the thickness of the first gate electrode portion 60A and the thickness of the second gate electrode portion 60B may be in the range of the thickness of the gate electrode 60 in the first embodiment.

Figure 19:
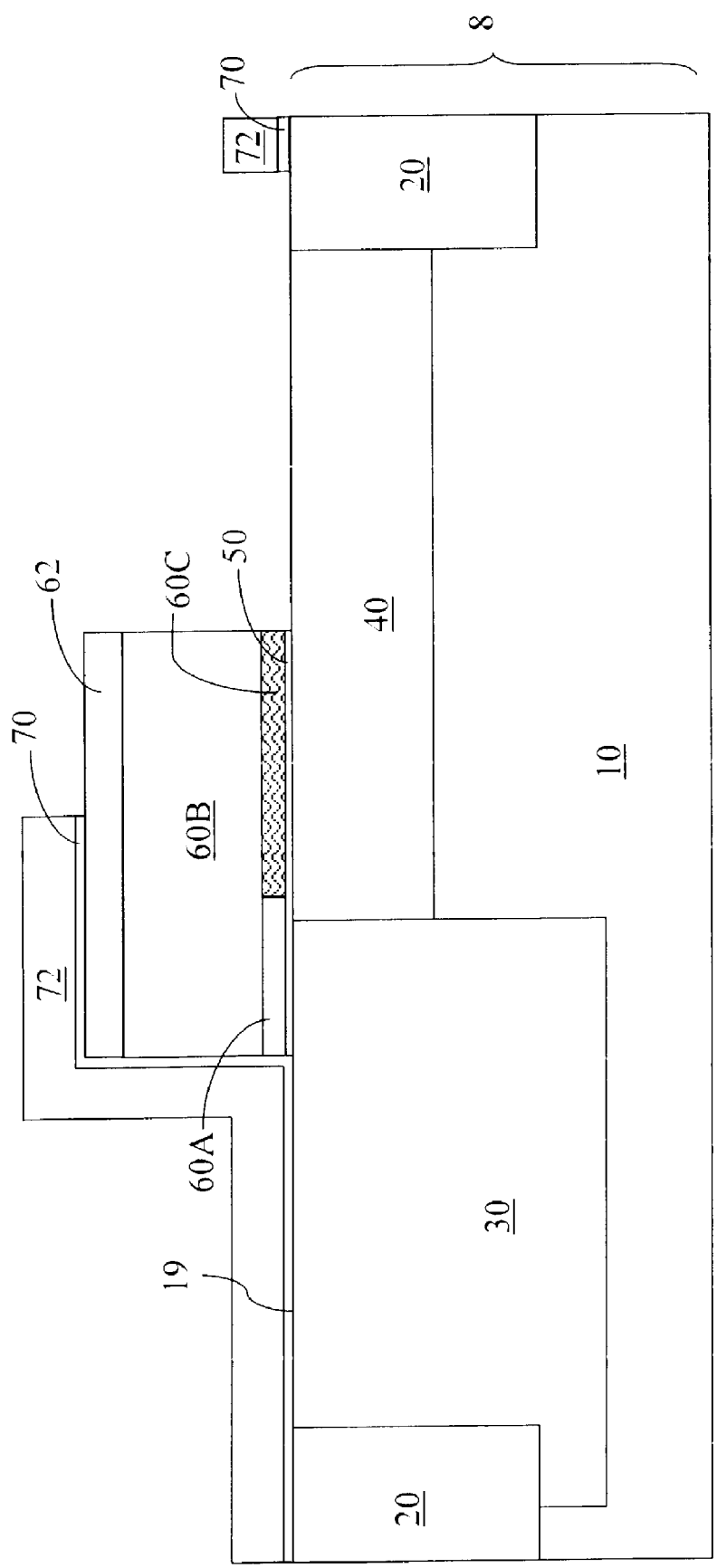

Referring to FIG. 19, a pad layer 70 and an oxygen-diffusion-resistant layer 72 are formed as in the first embodiment.

Figure 20:
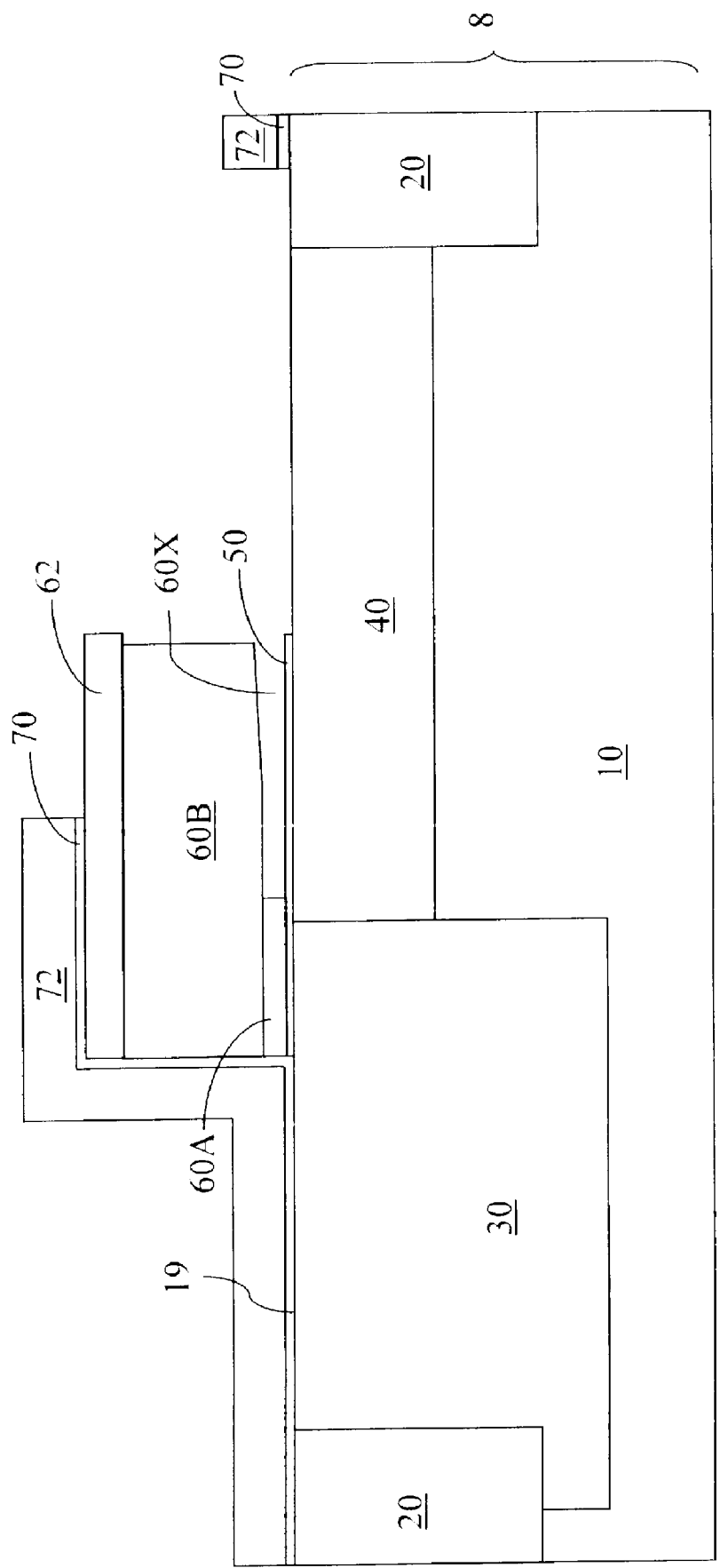

Referring to FIG. 20, the disposable gate electrode portion 60C is removed selective to the first gate electrode portion 60A and the second gate electrode portion 60B. Selectivity of the etch process relative to the first gate electrode portion 60A is effected by the differences in the doping concentration of the disposable gate electrode portion 60C, which is heavily doped, relative to the first gate electrode portion 60. Selectivity of the etch process relative to the second gate electrode portion 60B is effected by at least one of the differences in dopant concentration, in which case the second electrode portion has a light doping, a medium doping, or no doping, and the differences in composition that allows faster etching of the disposable gate electrode portion 60C relative to the second gate electrode portion 60B. Dopant concentration dependent etch processes displaying an etch selectivity ranging from about 5 to about 10 between a heavily doped silicon alloy and an undoped silicon alloy are known in the art. Further, alloy composition dependent etch processes are known in the art for silicon containing alloys such as silicon germanium alloys. A cavity 60X is formed in place of the etched disposable gate electrode portion 60C. A small taper may be present at a bottom surface of the second gate electrode 60B directly above the cavity 60X since the selectivity of the etch process is finite. Optionally, the gate dielectric 50 may be removed from directly below the cavity 60X without affecting subsequent structures significantly.

Figure 21:
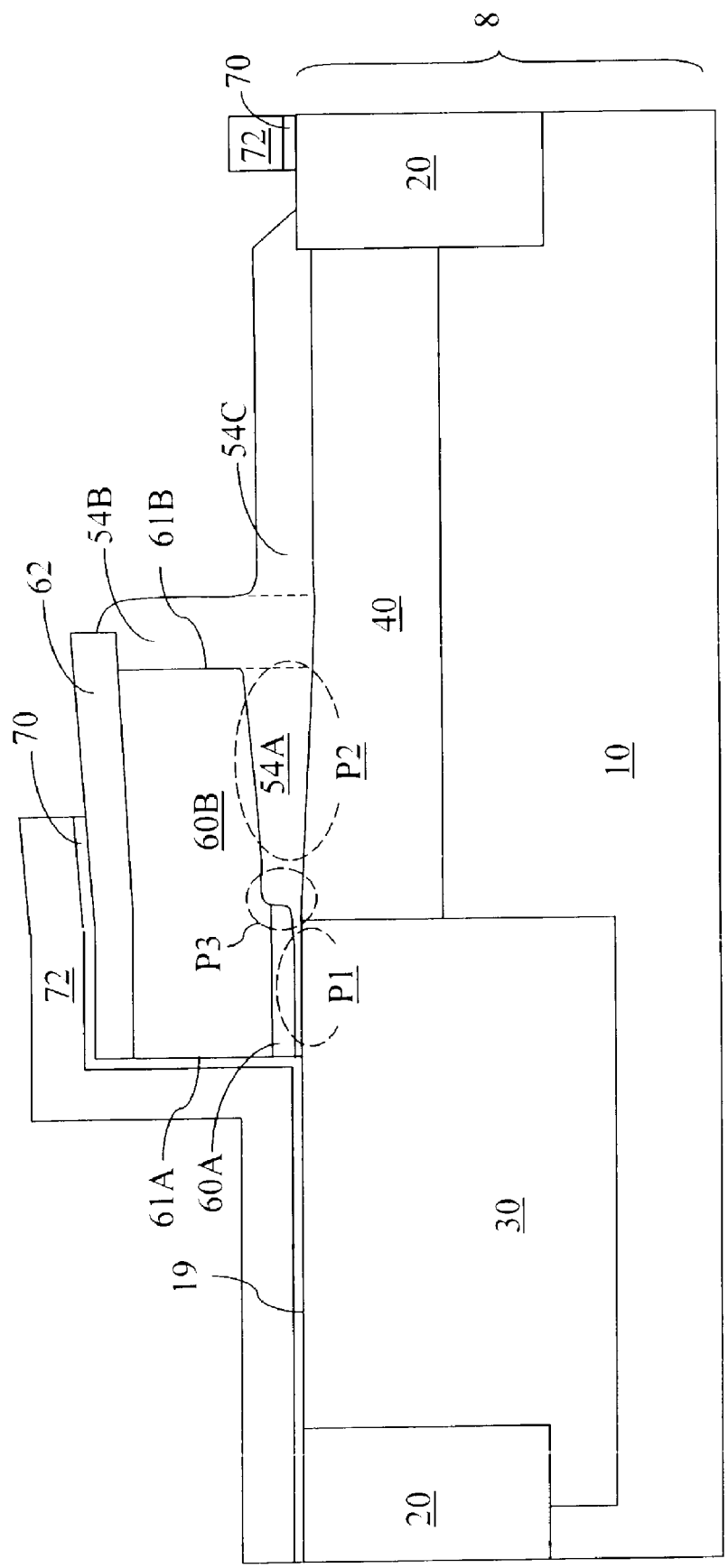

Referring to FIG. 21, thermal oxidation is performed as in the first embodiment. Due to the present of the cavity 60X in the beginning of the thermal oxidation process, a silicon oxide containing dielectric material grows simultaneous on the exposed bottom surface of the second gate electrode portion 60B and on an exposed portion of the gate dielectric 50 or an exposed surface of the drift region 40 directly beneath the cavity 60X. Expanded gate dielectric 54A, a thermal oxide portion 54B, and another thermal oxide portion 54C are formed as in the first embodiment. The thickness of the expanded gate dielectric 54A monotonically increases from the source side sidewall 61A to the drain side sidewall 61B as in the first embodiment. Further, the expanded gated dielectric 54A comprises a first portion P1 having substantially the same thickness, a second portion P2 having a strictly increasing thickness profile in the direction from the first portion P1 to the drain side sidewall 61B, and a third portion containing a stepwise increase in thickness between the first portion P1 and the second portion P2. Structural and compositional features of the thermal oxide portion 54B and the another thermal oxide portion 54C are the same as in the first embodiment.

Figure 22:
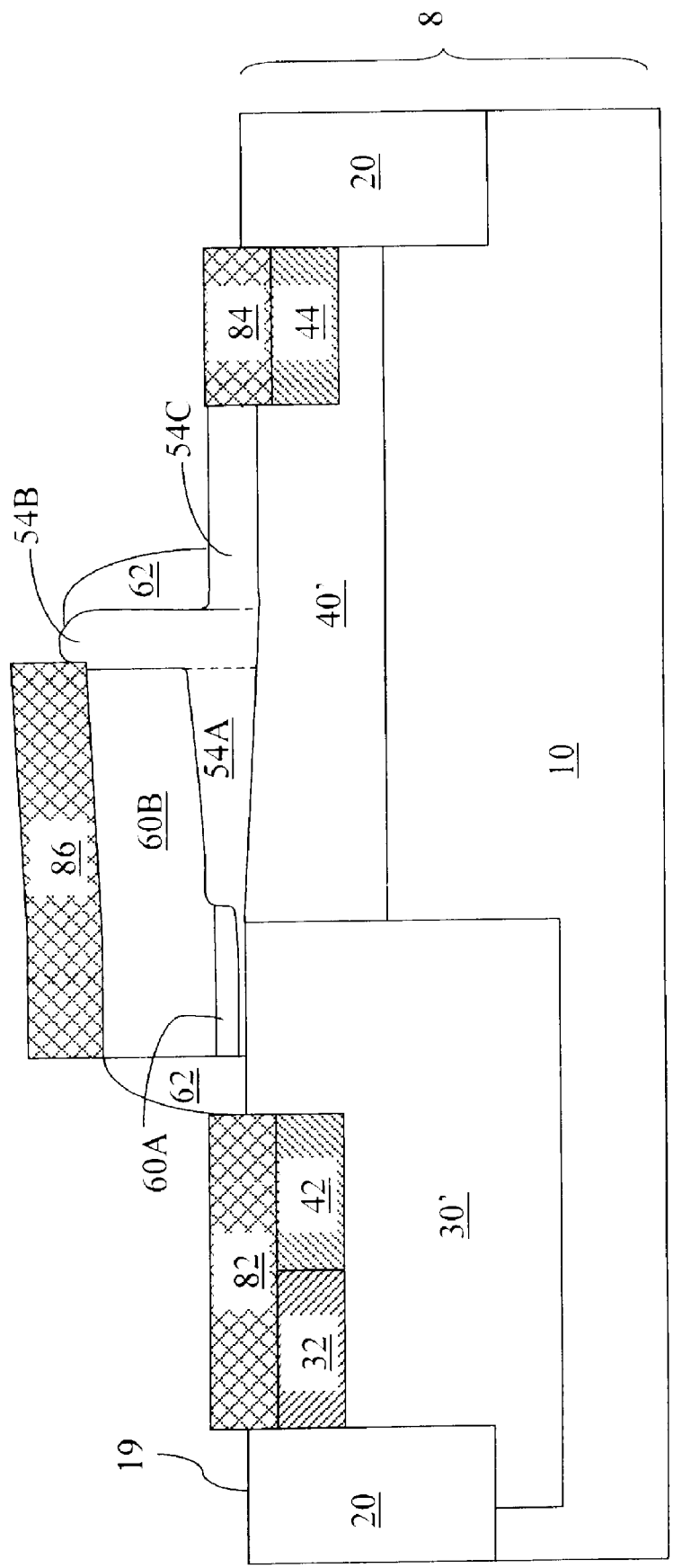

Referring to FIG. 22, the same processing steps are performed as in the first embodiment to remove the pad layer 70 and the oxygen-diffusion-resistant layer 72, to form a gate spacer 62, and to form a source region 42, a drain region 44, and a substrate contact semiconductor region 32. Further, a source and substrate metal contact 82, a drain metal contact 84, and a gate metal contact 86 are formed as in the first embodiment.

The second exemplary semiconductor structure is another lateral diffusion metal oxide semiconductor field effect transistor (LDMOSFET) having a gate dielectric, which is the expanded gate dielectric 54, of a monotonically increasing thickness from the source side sidewall 61A to the drain side sidewall 61B. The increased thickness on the drain side of the gate electrode 60 provides enhanced protection to the expanded gate dielectric 54A from a high drain voltage, while the thin first portion P1 directly above the first conductivity type region 30 provides enhanced electrical field in the first conductivity type region 30 to enhance the on-current of the inventive LDMOSFET.

Figure 23:
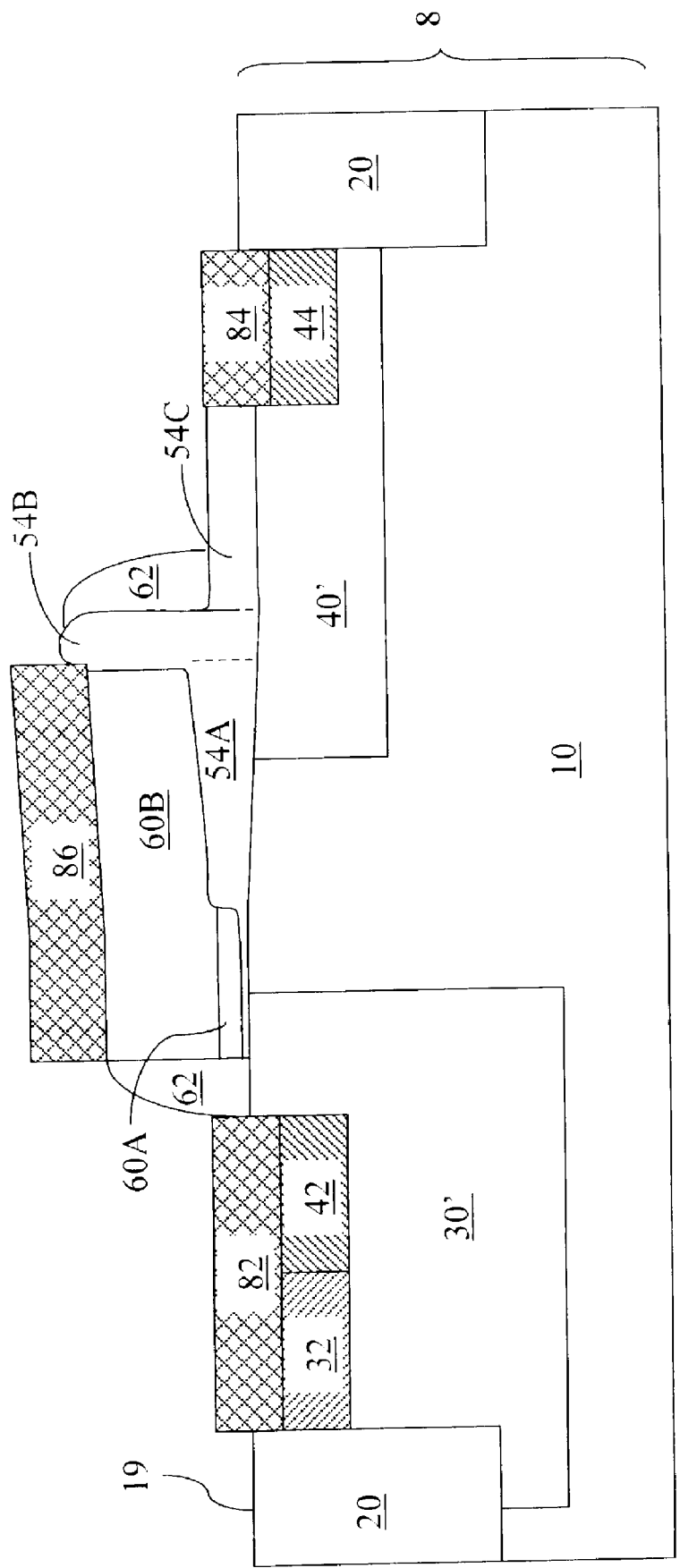

Referring to FIG. 23, a variation of the second exemplary semiconductor comprises a first conductivity type well 30' and the drift region 40' that are separated by a portion of the substrate semiconductor region 10 having a light doping of the first conductivity type. The light doping of the substrate semiconductor region 10 enables operation of the inventive LDMOSFET at a high drain voltage, for example, about 50 V or above.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a semiconductor substrate comprising a first silicon containing material;
    a gate electrode comprising a second silicon containing material, located on said semiconductor substrate, and having a first sidewall and a second sidewall that are located on opposite ends of said gate electrode;
    a gate dielectric containing a silicon oxide containing dielectric material and abutting said semiconductor substrate and a bottom surface of said gate electrode between said first sidewall and said second sidewall, wherein a vertical thickness of said gate dielectric monotonically increases from said first sidewall to said second sidewall; and
    a thermal oxide portion containing a thermal oxide of said second silicon containing material and laterally abutting an entirety of said second sidewall, wherein said gate dielectric and said thermal oxide portion are of integral construction and free of an interface therebetween.

2. The semiconductor structure of claim 1, further comprising another thermal oxide portion containing a thermal oxide of said first silicon containing material and vertically abutting said semiconductor substrate, wherein said thermal oxide has a substantially constant thickness, and wherein said thermal oxide portion and said another thermal oxide portion are of integral construction and free of an interface therebetween.

3. The semiconductor structure of claim 2, wherein said gate dielectric contains a first thermal oxide of said first silicon containing material and a second thermal oxide of said second silicon containing material, wherein said first and second thermal oxide are of integral construction.

4. The semiconductor structure of claim 3, wherein said first silicon containing material is silicon, said second silicon containing material is polysilicon, and said first thermal oxide and said second thermal oxide are thermal silicon oxide.

5. The semiconductor structure of claim 1, further comprising:
    a first conductivity type well having a doping of a first conductivity type, abutting said gate dielectric, and located underneath said first sidewall and in said semiconductor substrate; and
    a drift region having a doping of a second conductivity type, abutting said gate dielectric, and located underneath said second sidewall and in said semiconductor substrate, wherein said second conductivity type is the opposite of said first conductivity type.

6. The semiconductor structure of claim 5, wherein said first conductivity type well laterally abuts said drift region.

7. The semiconductor structure of claim 5, further comprising a substrate semiconductor region having a doping of said first conductivity type, abutting said gate electrode, and separating said first conductivity type well from said drain region.

8. The semiconductor structure of claim 5, further comprising:
    a source region having a doping of said second conductivity type and located in said first conductivity type well; and
    a drain region having a doping of said second conductivity type and located in said drift region.

9. The semiconductor structure of claim 8, wherein said semiconductor substrate comprises single crystalline silicon.

10. The semiconductor structure of claim 8, wherein said gate dielectric comprises a first portion having a substantially constant thickness and adjoining said first sidewall and a second portion having a constantly increasing thickness, adjoining said second sidewall, and having a substantially constant rate of increase in thickness per lateral length.

11. The semiconductor structure of claim 10, wherein said gate dielectric further comprises a third portion containing a stepwise increase in thickness between said first portion and said second portion.

12. The semiconductor structure of claim 8, further comprising:
    a drain metal contact comprising a metallic material and abutting said drain region;
    another thermal oxide portion containing a thermal oxide of said first silicon containing material having a substantially constant thickness and abutting said drift region and said drain metal contact, wherein said thermal oxide portion and said another thermal oxide portion are of integral construction and free of an interface therebetween.

* * * * *